(12) United States Patent
Tomaru et al.

(10) Patent No.: US 8,965,743 B2
(45) Date of Patent: Feb. 24, 2015

(54) STEERING DEVICE DESIGN ASSISTING APPARATUS AND STEERING DEVICE DESIGN ASSISTING METHOD

(75) Inventors: Masaki Tomaru, Maebashi (JP); Naoki Sawada, Maebashi (JP); Akira Ichikawa, Fujisawa (JP); Ryou Oosawa, Maebashi (JP)

(73) Assignee: NSK Ltd., Tokyo (JP)

( * ) Notice: Subject to any disclaimer, the term of this patent is extended or adjusted under 35 U.S.C. 154(b) by 484 days.

(21) Appl. No.: 13/318,283

(22) PCT Filed: Jul. 26, 2011

(86) PCT No.: PCT/JP2011/066982
§ 371 (c)(1),
(2), (4) Date: Oct. 31, 2011

(87) PCT Pub. No.: WO2012/046492
PCT Pub. Date: Apr. 12, 2012

(65) Prior Publication Data
US 2012/0185219 A1    Jul. 19, 2012

(30) Foreign Application Priority Data

Oct. 6, 2010   (JP) ................................ 2010-226305

(51) Int. Cl.
*G06F 17/50*   (2006.01)
*B62D 1/20*    (2006.01)
*B62D 1/16*    (2006.01)

(52) U.S. Cl.
CPC .. *B62D 1/20* (2013.01); *B62D 1/16* (2013.01); *G06F 17/5095* (2013.01)
USPC ........................................................... 703/8

(58) Field of Classification Search
None
See application file for complete search history.

(56) References Cited

U.S. PATENT DOCUMENTS 3,691,866 A * 9/1972 Berkes ............................ 74/493
2005/0284245 A1   12/2005 Chen
2008/0126042 A1 * 5/2008 Kim ................................... 703/8

FOREIGN PATENT DOCUMENTS

JP    2004175249 A    6/2004
JP    2008197899 A    8/2008

(Continued)

OTHER PUBLICATIONS

S. Kinme, T. Kamikawa, A. Nishino, K. Ikeda, S. Inoue, Development of Stamped Yoke for High-Rigidity Intermediate Shaft, Koyo Engineering Journal, 165; 54-58, (2004).*

(Continued)

*Primary Examiner* — Omar Fernandez Rivas
*Assistant Examiner* — Robert Brock
(74) *Attorney, Agent, or Firm* — Sughrue Mion, PLLC

(57) ABSTRACT

A design assisting apparatus of a steering device arranges a coordinate of a handle position reference point, a coordinate of a first universal joint reference point, a coordinate of a second universal joint reference point, and a coordinate of a steering gear reference point in a three-dimensional space, calculates a reference axis passing through the second universal joint reference point from the first universal joint reference point, calculates a phase angle which is an angle between a straight line from the handle position reference point to the first joint reference point when viewed along the reference axis and a straight line from the second joint reference point to the steering gear reference point when viewed along the reference axis, and determines success or failure of a condition in which the allowable range of the phase angle allowable error is included in the allowable range of the allowable torque variation rate.

20 Claims, 32 Drawing Sheets

(56) References Cited

FOREIGN PATENT DOCUMENTS

| | | |
|---|---|---|
| JP | 2008269080 A | 11/2008 |
| WO | 2004049215 A1 | 10/2004 |
| WO | 2012046492 A1 | 4/2012 |

OTHER PUBLICATIONS

Authors Unknown, Couplings and Universal Joints, http://web.archive.org/web/20091026091909/http://www.sdp-si.com/D757/couplings3.htm , Oct. 26, 2009, as retrieved on Jul. 15, 2014, 6 pages.*

Guohui Yan, Analysis and Optimization of Torque Variation in Steering Column Assembly, Proceedings of the FISITA 2012 World Automotive Congress Lecture Notes in Electrical Engineering vol. 198, 2013, pp. 57-67.*

I. S. Fischer and R. N. Paul, Kinematic Displacement Analysis of a Double-Cardan-Joint Driveline, Journal of Mechanical Design, Sep. 1991, vol. 113, pp. 263-271.*

International Search Report PCT/JP2011/066982; Oct. 12, 2011.

Written opinion for PCT/JP2011/066982; Jul. 26, 2011.

* cited by examiner

FIG.15

COORDINATE DATA — 500

| | | x | y | z | |
|---|---|---|---|---|---|
| HANDLE ORIGINAL POINT: | H | 966 | -385 | 704 | mm |
| HANDLE-SIDE JOINT POINT: | HJ | 418 | -385 | 419 | mm |
| GEAR-SIDE JOINT POINT: | GJ | 229 | -302 | 213 | mm |
| GEAR INTERSECTION POINT: | GC | 173 | -224 | 5 | mm |

TILT AND TELESCO INFORMATION
Pivot POINT (TILT POINT)

| | | |
|---|---|---|
| DISTANCE FROM POINT H (ON COLUMN OUTPUT SHAFT) | 566 | mm |
| DISTANCE FROM COLUMN OUTPUT SHAFT (HEIGHT) | 36 | mm |

TILT AMOUNT

| | | |
|---|---|---|
| TILT UP AMOUNT | 15 | mm |
| TILT DOWN AMOUNT | -10 | mm |

TELESCO AMOUNT

| | | |
|---|---|---|
| TELESCO CONTRACTION AMOUNT | -20 | mm |
| TELESCO EXPANSION AMOUNT | 16 | mm |

| TILT UP COORDINATE DATA | x | y | z | |
|---|---|---|---|---|
| HANDLE ORIGINAL POINT: H | 960 | -385 | 718 | mm |
| HANDLE-SIDE JOINT POINT: HJ | 419 | -385 | 418 | mm |
| TILT DOWN COORDINATE DATA | x | y | z | |
| HANDLE ORIGINAL POINT: H | 970 | -385 | 695 | mm |
| HANDLE-SIDE JOINT POINT: HJ | 416 | -385 | 420 | mm |

FIG.19

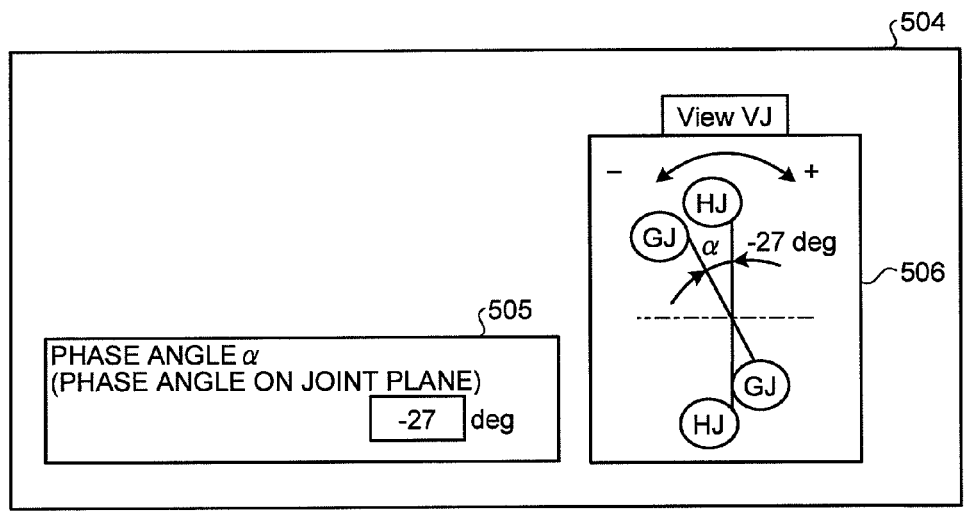

FIG.20

| LENGTH | | | | | |
|---|---|---|---|---|---|
| | | | TILT UP | TILT DOWN | |
| BETWEEN H AND HJ (COLUMN LENGTH) | 618 | mm | | | |
| BETWEEN HJ AND GJ (JOINT LENGTH W) | 291 | mm | 292 | 290 | mm |
| BETWEEN GJ AND GC (PINION LENGTH) | 229 | mm | | | |
| LENGTH, ANGLE | | | TILT UP | TILT DOWN | |
| COLUMN SIDE VIEW ANGLE | 28 | deg | 29 | 26 | deg |
| COLUMN PLAN VIEW ANGLE | 0 | deg | | | |
| PINION BACK SURFACE ANGLE | -20 | deg | TILT UP | TILT DOWN | |
| PINION BACK INCLINATION ANGLE | 15 | deg | | | |
| INTERSECTION ANGLE BETWEEN POINTS H AND J | 26 | deg | 24 | 27 | deg |
| INTERSECTION ANGLE BETWEEN POINTS G AND J | 26 | deg | 27 | 26 | deg |

| β > γ ESTABLISHMENT ○  β > γ NON-ESTABLISHMENT × | | | | | |
|---|---|---|---|---|---|
| TORQUE VARIATION RATE (%) \ PHASE ANGLE ALLOWABLE ERROR | $\alpha \pm 7$ | $\alpha \pm 8$ | $\alpha \pm 9$ | $\alpha \pm 10$ | $\alpha \pm 11$ |
| 3 | × | × | × | × | × |
| 4 | ○ | ○ | × | × | × |
| 5 | ○ | ○ | ○ | ○ | × |
| 6 | ○ | ○ | ○ | ○ | ○ |
| 7 | ○ | ○ | ○ | ○ | ○ |

FIG.36A

| SLIDE TUBE YOKE COMPONENT | $T_1$ | $T_2$ | $T_3$ | $T_4$ | $T_5$ |
|---|---|---|---|---|---|
| TUBE LENGTH (mm) | 100 | 120 | 140 | 160 | 180 |
| PHASE ANGLE ERROR (deg) | $\alpha_1 \pm 3°$ | $\alpha_2 \pm 3°$ | $\alpha_3 \pm 2°$ | $\alpha_4 \pm 4°$ | $\alpha_5 \pm 3°$ |

FIG.36B

| SLIDE SHAFT YOKE COMPONENT | S1 | S2 | S3 | S4 | S5 |
|---|---|---|---|---|---|
| SHAFT LENGTH (mm) | 100 | 120 | 140 | 160 | 180 |
| PHASE ANGLE ERROR (deg) | $\beta_1 \pm 4°$ | $\beta_2 \pm 2°$ | $\beta_3 \pm 5°$ | $\beta_4 \pm 4°$ | $\beta_5 \pm 3°$ |

FIG.36C

| | TARGET FITTING LENGTH (mm) |
|---|---|
| $X_1$ | 30 |
| $X_2$ | 50 |
| $X_3$ | 70 |

|  |  | BEARING COMPONENT | | | |
|---|---|---|---|---|---|
|  |  | B1 | | B2 | |
|  |  | ALLOWABLE JOINT RATTLING AMOUNT (MINUTE) | FRICTION AMOUNT | ALLOWABLE JOINT RATTLING AMOUNT (MINUTE) | FRICTION AMOUNT |
| CROSS SHAFT FREE JOINT COMPONENT | C1 | 1 | 0.005 | 1 | 0.005 |
| | C2 | 0 | 0.01 | 0 | 0.01 |

333333333333333333333333333# STEERING DEVICE DESIGN ASSISTING APPARATUS AND STEERING DEVICE DESIGN ASSISTING METHOD

CROSS REFERENCE TO RELATED APPLICATIONS

This application is a National Stage of International Application No. PCT/JP2011/066982 filed on Jul. 26, 2011, which claims priority from Japanese Patent Application No. 2010-226305, filed on Oct. 6, 2010, the contents of all of which are incorporated herein by reference in their entirety.

TECHNICAL FIELD

The present invention relates to a steering device design assisting apparatus and a steering device design assisting method for assisting a design of a steering device of a vehicle.

BACKGROUND ART

A steering device transmits a motion of a steering shaft rotated by an operation of a handle to a pinion shaft as an input shaft of a steering gear. A direction of a wheel is changed by the transmitted motion of the steering gear. In general, the rotary axis of the steering shaft and the axis of the pinion shaft may not be coaxially present. Therefore, an intermediate shaft is provided between the steering shaft and the steering gear through a universal joint, and the end of the intermediate shaft and the steering shaft are coupled to each other. Further, the end of the intermediate shaft and the end of the pinion shaft are coupled to each other through a universal joint. Due to the presence of two universal joints and the intermediate shaft, power transmission is carried out between the steering shaft and the input shaft of the steering gear which are not present on the same straight line with each other.

The intermediate shaft is disposed in a three-dimensional space between the steering shaft and the pinion shaft. In order to equalize the rotational angular velocity of the steering shaft with the rotational angular velocity of the pinion shaft, it is necessary that an intermediate shaft module be disposed so that the angle formed between the rotary axis of the steering shaft and the rotary axis of the intermediate shaft is equal to the angle formed between the axis of the steering gear and the rotary axis of the intermediate shaft. Further, in recent years, the steering device that steers the wheel of the vehicle has been designed by utilizing a simulation technique. For example, there are known techniques disclosed in Patent Literatures 1 to 3.

CITATION LIST

Patent Literature

Patent Literature 1: Japanese Patent Application Laid-Open No. 2004-175249
Patent Literature 2: Japanese Patent Application Laid-Open No. 2008-197899
Patent Literature 3: Japanese Patent Application Laid-Open No. 2008-269080

SUMMARY OF INVENTION

Technical Problem

However, even if the intermediate shaft is disposed so that the rotational angular velocities of the steering shaft and the steering gear are equal, it is necessary to consider a difference caused by manufacturing errors and a variation in torque caused by changing of tilt, and therefore, a design effort is needed to repetitively verify a variation in torque and a spatial arrangement.

The invention is contrived in consideration of the above-described circumstances, and it is an object of the invention to provide a steering device design assisting apparatus and a steering device design assisting method for assisting a design of a steering device with an intermediate shaft to fall within a predetermined allowable torque variation.

Solution to Problem

According to an aspect of the present invention, a design assisting apparatus of a steering device including a steering mechanism with a column yoke, a slide tube yoke, a slide shaft yoke, and a pinion-side yoke includes: a storage unit that stores a coordinate of a handle position reference point of a handle, a coordinate of a first universal joint reference point connecting the column yoke and the slide tube yoke, a coordinate of a second universal joint reference point connecting the slide shaft yoke and the pinion-side yoke, a coordinate of a steering gear reference point, an allowable torque variation rate, and a phase angle allowable error; a reference point arrangement unit that arranges the coordinate of the handle position reference point, the coordinate of the first universal joint reference point, the coordinate of the second universal joint reference point, and the coordinate of the steering gear reference point, in a three-dimensional space in which the longitudinal, vertical, and lateral directions of a vehicle are determined; a reference axis calculation unit that calculates a reference axis passing through the second universal joint reference point from the first universal joint reference point; a phase angle calculation unit that calculates a phase angle which is an angle between a straight line from the handle position reference point to the first joint reference point when viewed along the reference axis and a straight line from the second joint reference point to the steering gear reference point when viewed along the reference axis; and an allowable range determination unit that determines success or failure of a condition in which an allowable range of the phase angle allowable error is included in an allowable range of the allowable torque variation rate.

According to another aspect of the present invention, the allowable range determination unit determines success or failure of a condition in which the allowable range of the phase angle allowable error is included in the allowable range of the allowable torque variation rate, in each stage of an up stage, a middle stage, and a down stage of a tilt operation.

According to another aspect of the present invention, the design assisting apparatus further includes: an input unit that accepts a change of the allowable torque variation rate or the phase angle allowable error; and a display unit that displays the allowable range of the allowable torque variation rate and the allowable range of the phase angle allowable error. The storage unit stores the allowable torque variation rate or the phase angle allowable error changed through the input unit. The allowable range determination unit calculates an allowable range of the allowable torque variation rate based on the allowable torque variation rate stored in the storage unit and an allowable range of the phase angle allowable error based on the phase angle allowable error stored in the storage unit, and the display unit simultaneously displays the allowable range of the allowable torque variation rate calculated in the allowable range determination unit and the allowable range of the phase angle allowable error calculated in the allowable range determination unit.

According to another aspect of the present invention, the allowable range determination unit highlights on the display unit, in a case of failure of the condition in which the allowable range of the phase angle allowable error is included in the allowable range of the allowable torque variation rate.

According to another As a preferable aspect of the present invention, the allowable range determination unit creates a condition establishment table indicating a combination of the condition in which the allowable range of the phase angle allowable error is included in the allowable range of the allowable torque variation rate.

According to another aspect of the present invention, the design assisting apparatus further includes: a storage unit that stores a data table of a mass production component; a component condition calculation unit that calculates a component condition from the coordinate of the handle position reference point, the coordinate of the first universal joint reference point, the coordinate of the second universal joint reference point, and the coordinate of the steering gear reference point; and a component selection unit that selects a mass production component from the data table of the mass production component based on the component condition and the condition establishment table.

According to another of the present invention, the component selection unit selects the column yoke, the slide tube yoke, the slide shaft yoke, and the pinion-side yoke, and a connection point between the column yoke and the slide tube yoke is arranged at the first universal joint reference point in the three-dimensional space, and a connection point between the slide shaft yoke and the pinion-side yoke is arranged at the second universal joint reference point in the three-dimensional space.

According to an aspect of the present invention, a design assisting method of a steering device for assisting a design of the steering device including a steering mechanism with a column yoke, a slide tube yoke, a slide shaft yoke, and a pinion-side yoke, using a computer, includes: storing a coordinate of a handle position reference point of a handle, a coordinate of a first universal joint reference point connecting the column yoke and the slide tube yoke, a coordinate of a second universal joint reference point connecting the slide shaft yoke and the pinion-side yoke, a coordinate of a steering gear reference point, an allowable torque variation rate, and a phase angle allowable error; arranging the coordinate of the handle position reference point, the coordinate of the first universal joint reference point, the coordinate of the second universal joint reference point, and the coordinate of the steering gear reference point in a three-dimensional space in which the longitudinal, vertical, and lateral directions of a vehicle are determined; calculating a reference axis passing through the second universal joint reference point from the first universal joint reference point; calculating a phase angle which is an angle between a straight line from the handle position reference point to the first joint reference point when viewed along the reference axis and a straight line from the second joint reference point to the steering gear reference point when viewed along the reference axis; and determining success or failure of a condition in which an allowable range of the phase angle allowable error is included in an allowable range of the allowable torque variation rate.

According to another aspect of the present invention the determining includes determining success or failure of a condition in which the allowable range of the phase angle allowable error is included in the allowable range of the allowable torque variation rate, in each stage of an up stage, a middle stage, and a down stage of a tilt operation.

According to another aspect of the present invention, the design assisting method further includes: displaying the allowable range of the allowable torque variation rate and the allowable range of the phase angle allowable error calculated in the determining. The determining includes, when at least one of the allowable torque variation rate and the phase angle allowable error stored in the storing is changed, calculating at least one of an allowable range of the allowable torque variation rate based on the changed allowable torque variation rate or an allowable range of the phase angle allowable error based on the changed phase angle allowable error, and the displaying includes simultaneously displaying the allowable range of the allowable torque variation rate calculated in the determining and the allowable range of the phase angle allowable error calculated in the determining.

According to another aspect of the present invention, the displaying includes highlighting when the failure of the condition in which the allowable range of the phase angle allowable error is included in the allowable range of the allowable torque variation rate is determined in the determining.

According to another aspect of the present invention, the determining includes creating a condition establishment table indicating a combination of the condition in which the allowable range of the phase angle allowable error is included in the allowable range of the allowable torque variation rate.

According to another aspect of the present invention, the design assisting method further includes: storing a data table of a mass production component; calculating a component condition from the coordinate of the handle position reference point, the coordinate of the first universal joint reference point, the coordinate of the second universal joint reference point, and the coordinate of the steering gear reference point; and selecting a mass production component from the data table of the mass production component based on the component condition and the condition establishment table.

According to another aspect of the present invention, the selecting includes selecting the column yoke, the slide tube yoke, the slide shaft yoke, and the pinion-side yoke, and the design assisting method includes arranging a connection point between the column yoke and the slide tube yoke at the first universal joint reference point in the three-dimensional space, and arranging a connection point between the slide shaft yoke and the pinion-side yoke at the second universal joint reference point in the three-dimensional space.

Advantageous Effect of the Invention

According to the invention, the designer may get assistance of facilitating the design of the steering device with the intermediate shaft to fall within the predetermined allowable torque variation.

BRIEF DESCRIPTION OF DRAWINGS

FIG. 15 is a diagram illustrating an example of a design information input screen.

FIG. 16 is a diagram illustrating an example of another design information input screen.

FIG. 19 is a diagram illustrating an example of an output display screen displaying a calculation result of a phase angle α.

FIG. 20 is a diagram illustrating an example of an output display screen displaying a calculation result of a component condition.

FIG. 36A is a diagram illustrating an example of a mass production component data table.

FIG. 36B is a diagram illustrating an example of a mass production component data table.

FIG. 36C is a diagram illustrating an example of a mass production component data table.

DESCRIPTION OF EMBODIMENTS

Figure 1:
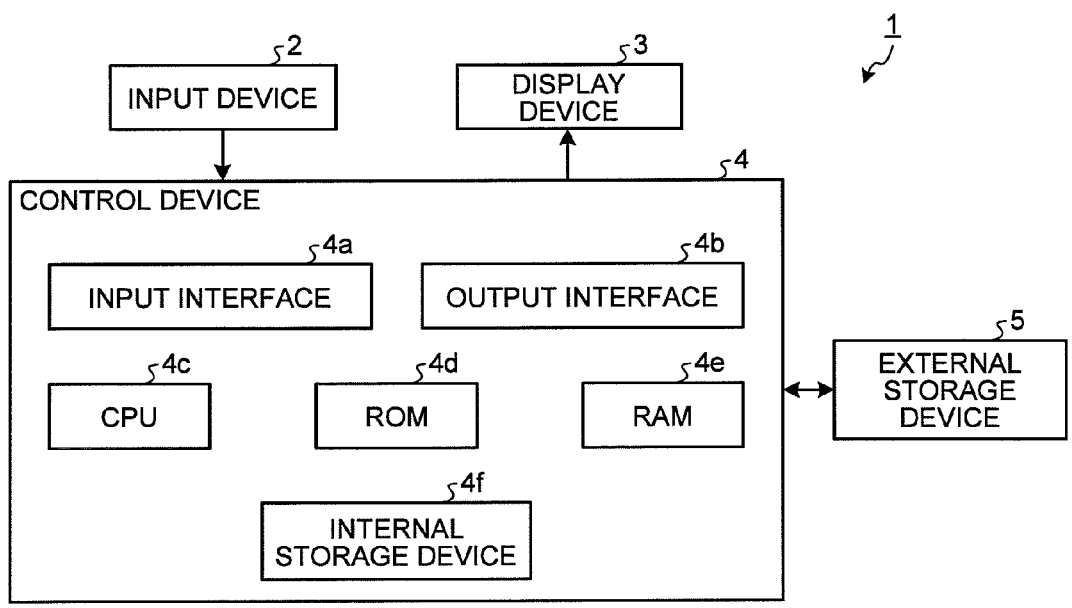
FIG. 1 is a diagram illustrating a configuration of a steering device design assisting apparatus of the embodiment.

A mode for carrying out the present invention (an embodiment) will be described in detail by referring to the drawings. It should be noted that the present invention is not limited by the following explanation. In addition, the components described in the following explanation include those that can be easily thought of by the person skilled in the art, and substantially equivalents. Further, the components described in the following explanation can be appropriately combined with each other. Furthermore, the device, the system, the method, and the modified example described in the embodiment can be appropriately combined with each other within the apparent scope of the person skilled in the art.

FIG. 1 is a diagram illustrating a configuration of a design assisting apparatus of a steering device according to the embodiment. As shown in FIG. 1, a steering device design assisting apparatus 1 includes an input device 2, a display device 3, a control device 4, and an external storage device 5.

The input device 2 is a mouse, a keyboard, or the like, and is an input unit that accepts an input operation and a selection operation of a designer as a user, and outputs an input signal to the control device 4. The display device 3 is a display unit such as a CRT (Cathode Ray Tube) and a liquid crystal display that displays an image.

The control device 4 is a computer such as a personal computer (PC), and includes an input interface 4a, an output interface 4b, a CPU (Central Processing Unit) 4c, a ROM (Read Only Memory) 4d, a RAM (Random Access Memory) 4e, and an internal storage device 4f. The input interface 4a, the output interface 4b, the CPU 4c, the ROM 4d, the RAM 4e, and the internal storage device 4f are connected to each other via an internal bus.

The input interface 4a receives an input signal from the input device 2 and outputs the signal to the CPU 4c. The output interface 4b receives an image signal from the CPU 4c and outputs the signal to the display device 3.

The ROM 4d stores a program such as a BIOS (Basic Input Output System). The internal storage device 4f is, for example, an HDD, a flash memory, or the like and stores an operating system program or an application program. The CPU 4c realizes various functions by executing a program stored in the ROM 4d or the internal storage device 4f while using the RAM 4e as a work area.

The external storage device 5 is an HDD (Hard Disk Drive), a server, or the like. In the case where the external storage device 5 is the server, the external storage device 5 is connected to the control device 4 via a network such as a LAN. The external storage device 5 may be installed at a place separated from the control device 4.

The internal storage device 4f or the external storage device 5 stores an existing module database which includes information on a component constituting a steering and having a production history.

Figure 2:
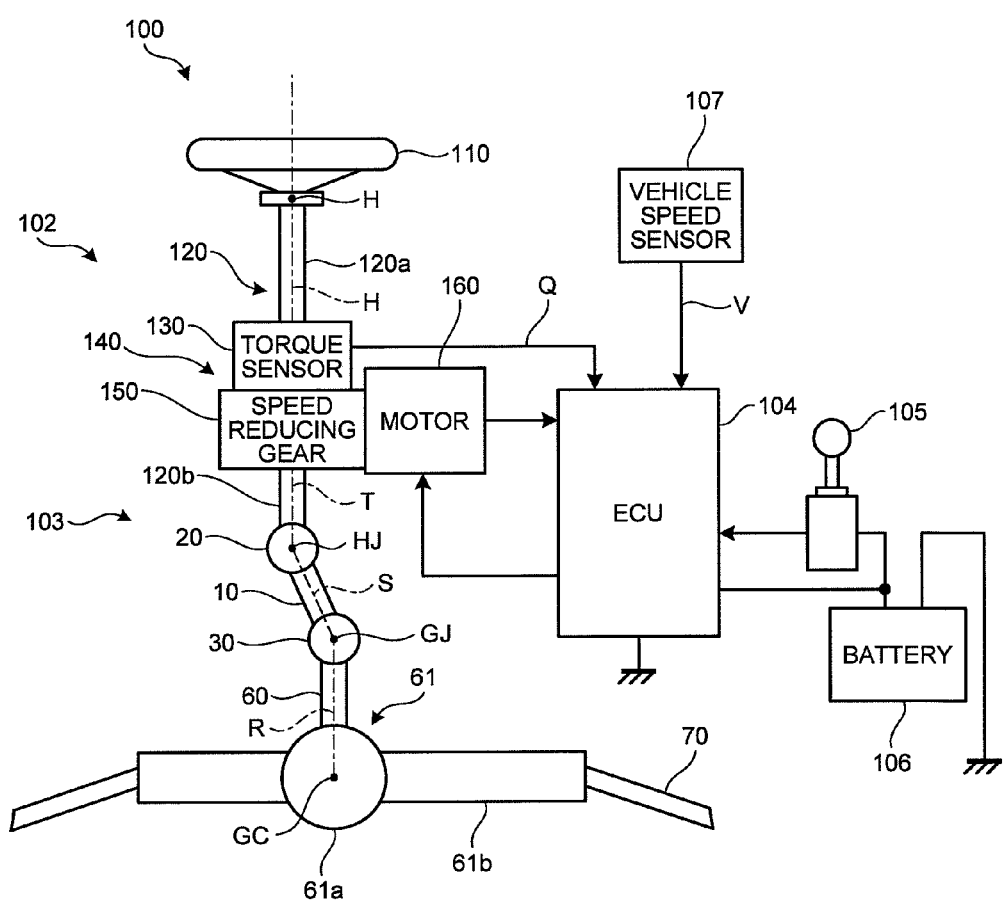
FIG. 2 is a diagram schematically describing a vehicle.

FIG. 2 is a block diagram illustrating a schematic configuration of a steering device mounted on a vehicle. A vehicle 100 includes a steering device 102, a steering mechanism 103 of the steering device 102, a control unit 104, an ignition switch 105, a battery 106, and a vehicle speed sensor 107. Furthermore, the vehicle 100 includes various components such as an engine and a wheel normally used in the vehicle in addition to the components shown in FIG. 2. The steering device 102 shown in FIG. 2 is an electric power steering device.

The steering device 102 includes a handle (steering wheel) 110 operated by a driver, a steering shaft 120 transmitting a rotation input from the handle 110, a torque sensor 130 detecting a torque input to the steering shaft 120 and a rotary angle of the steering shaft 120, and an auxiliary steering mechanism 140 assisting the rotation of the steering shaft 120 on the basis of the torque detected by the torque sensor 130. The steering device 102 detects a steering torque generated in the steering shaft 120 in accordance with the operation of the handle 110 through the torque sensor 130. Furthermore, the steering device 102 assists the steering force of the handle 110 by generating an auxiliary steering torque in accordance with a driving control of an electric motor 160 using the control unit 104 on the basis of the detected signal.

The steering shaft 120 connected to the handle 110 includes an input shaft 120a on which the driver's steering force is exerted and a column output shaft 120b, and the torque sensor 130 and a speed reducing gear box 150 are interposed between the input shaft 120a and the column output shaft 120b. The steering force transmitted to the column output shaft 120b of the steering shaft 120 is transmitted to the steering mechanism 103.

The torque sensor 130 detects a steering force transmitted to the input shaft 120a through the handle 110 as a steering torque.

The auxiliary steering mechanism 140 is connected to the column output shaft 120b of the steering shaft 120 to transmit an auxiliary steering torque to the column output shaft 120b.

The auxiliary steering mechanism 140 includes the speed reducing gear box 150 connected to the column output shaft 120b and the electric motor 160 connected to the speed reducing gear box 150 to generate the auxiliary steering torque. Furthermore, a column is constituted by the steering shaft 120, the torque sensor 130, and the speed reducing gear box 150, and the electric motor 160 applies an auxiliary steering torque to the column output shaft 120b of the column. That is, the electric power steering device of the embodiment is of a column assist type.

The steering mechanism 103 of the steering device 102 includes a universal joint 20, an intermediate shaft module 10, a universal joint 30, a pinion shaft 60, a steering gear 61, and a tie-rod 70. The steering force transmitted from the steering device 102 to the steering mechanism 103 is transmitted to the intermediate shaft module 10 through the universal joint 20, and is transmitted to the pinion shaft 60 through the universal joint 30. The steering force transmitted to the pinion shaft 60 is transmitted to the tie-rod 70 through the steering gear 61, so that a turned wheel (not shown) is turned. The steering gear 61 is formed in a rack-and-pinion type including a pinion 61a connected to the pinion shaft 60 and a rack 61b meshing with the pinion 61a, and converts a rotational movement transmitted to the pinion 61a into a linear movement in the rack 61b.

The control unit (Electronic Control Unit, ECU) 104 controls the driving of the vehicle 100 such as the electric motor 160 and the engine. Power is supplied from the battery 106 to the control unit 104 when the ignition switch 105 is in an on state. The control unit 104 calculates an auxiliary steering instruction value of an assist instruction on the basis of a steering torque Q detected in the torque sensor 130 and a traveling speed V detected in the vehicle speed sensor 107, and controls a value of a current supplied to the electric motor 160 on the basis of the calculated auxiliary steering instruction value.

The steering device 102 of the embodiment is provided with a tilting mechanism and a telescopic mechanism, so that the tilting position of the handle 110 and the position of the handle 110 in the longitudinal direction of the vehicle body are changeable. When the position of the handle is changed in accordance with the operation of the tilting mechanism and the telescopic mechanism, a handle position reference point H moves. The handle position reference point H is positioned on an axis T of the rotation center of the steering shaft 120. A connection reference point HJ of the universal joint 20 where the column output shaft 120b of the steering shaft 120 is connected to the intermediate shaft module 10, is positioned on the axis T of the rotation center of the steering shaft 120. The intermediate shaft module 10 and the universal joint 20 are connected to each other at the connection reference point HJ of the universal joint 20. The connection reference point HJ of the universal joint 20 is positioned on a reference axis S of the rotation center of the intermediate shaft module 10. A connection reference point GJ of the universal joint 30 where the intermediate shaft module 10 is connected to the pinion shaft 60, is positioned on the reference axis S of the rotation center of the intermediate shaft module 10. The connection reference point GJ of the universal joint 30 is positioned on an axis R of the rotation center of the pinion shaft 60. A steering gear reference point GC which is an intersection point between the pinion shaft 60 and the steering gear 61, is also positioned on the axis R of the rotation center of the pinion shaft 60.

Figure 3:
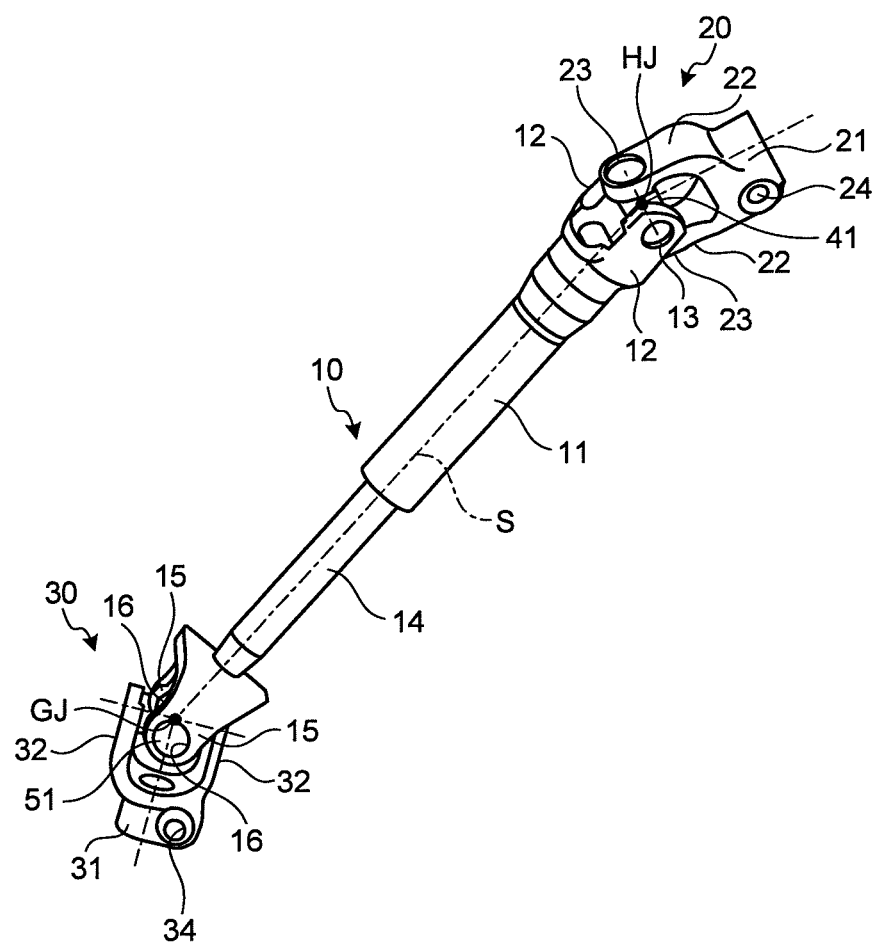
FIG. 3 is a diagram illustrating an example of an intermediate shaft module.
Figure 4:
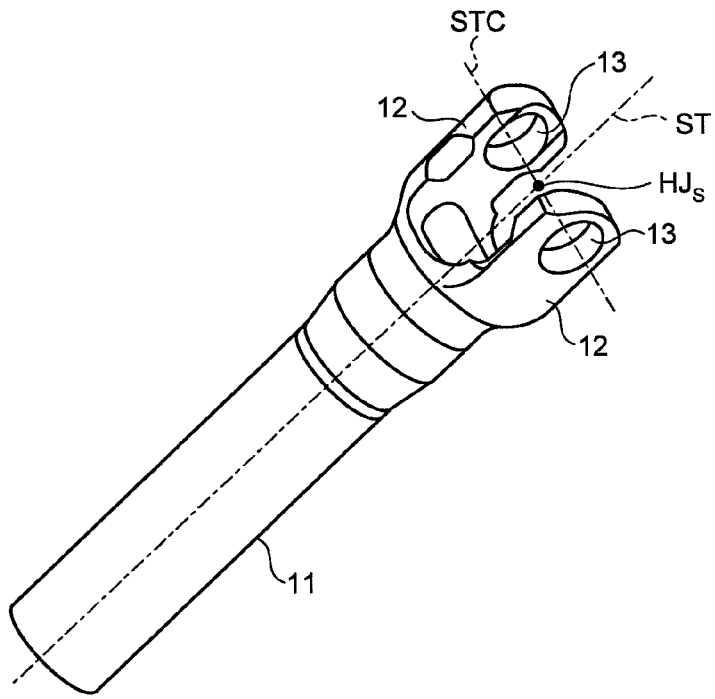
FIG. 4 is a diagram illustrating an example of a slide tube yoke used in the intermediate shaft module.
Figure 5:
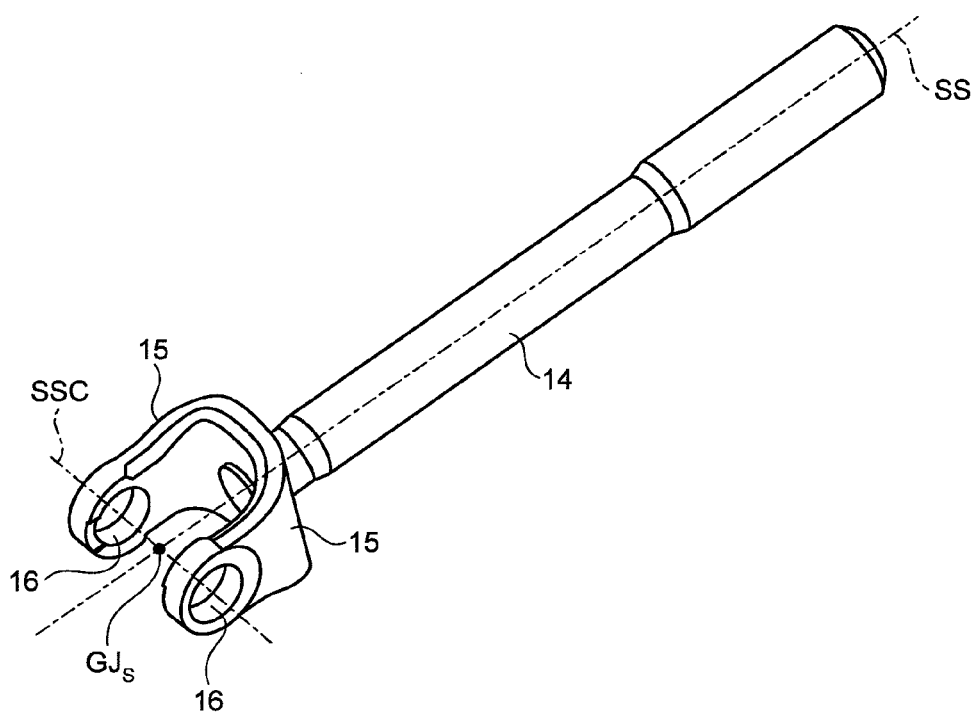
FIG. 5 is a diagram illustrating an example of the slide shaft yoke used in the intermediate shaft module.
Figure 6:
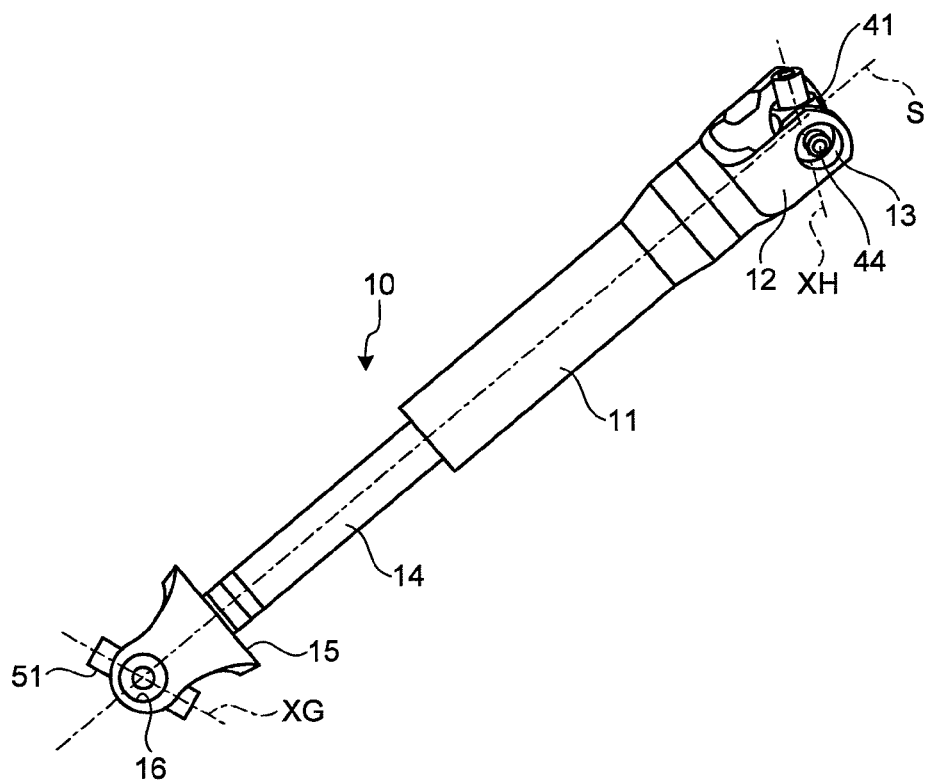
FIG. 6 is a diagram illustrating an interposed state of a cross shaft excluding a bearing used in the intermediate shaft module.
Figure 7:
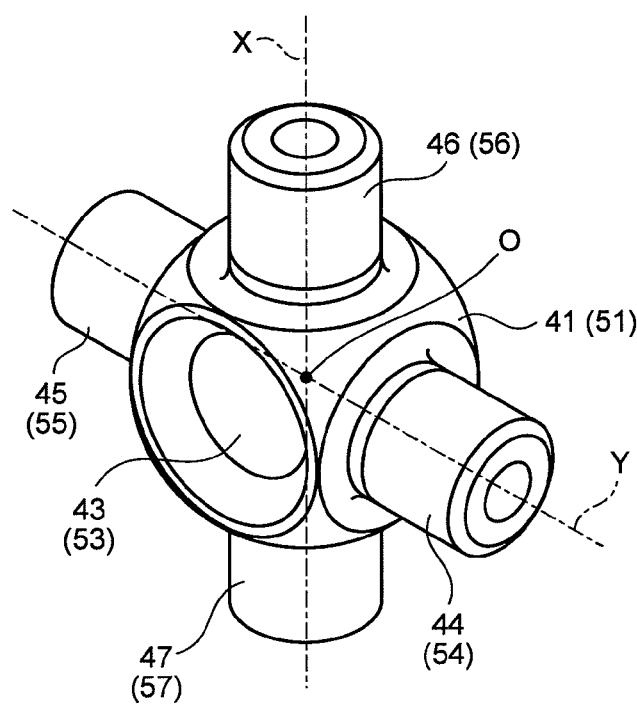
FIG. 7 is a diagram illustrating an example of the cross shaft excluding the bearing used in the intermediate shaft module.
Figure 8:
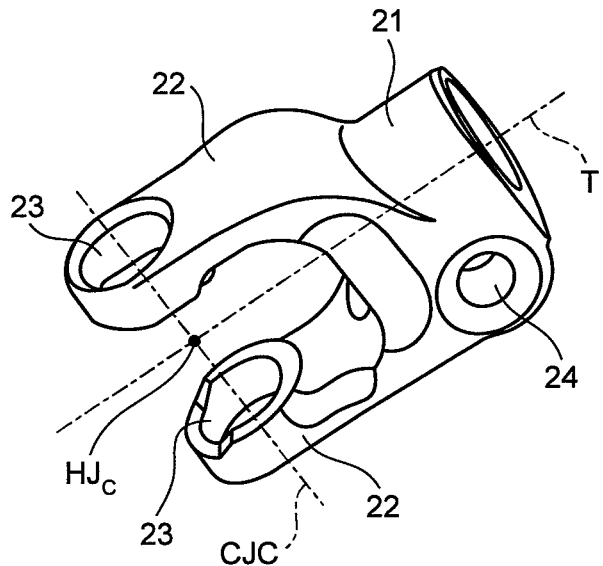
FIG. 8 is a diagram illustrating an example of a column yoke.
Figure 9:
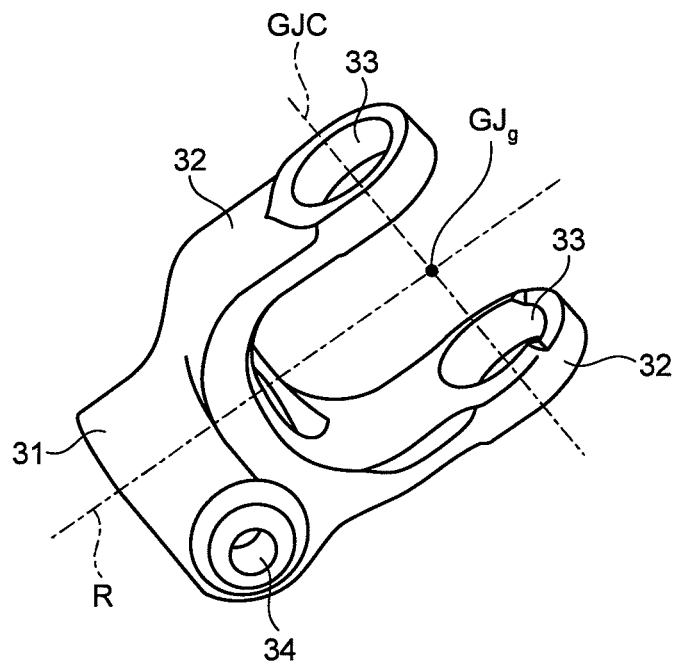
FIG. 9 is a diagram illustrating an example of a pinion-side yoke.
Figure 10:
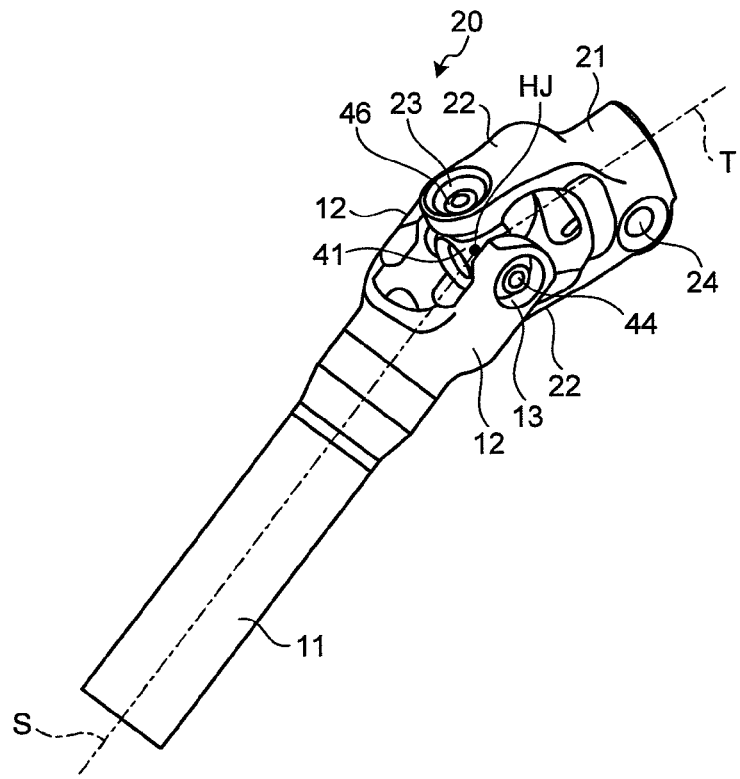
FIG. 10 is a diagram illustrating a relation between a cross shaft free joint and the pinion-side yoke of the steering gear module.
Figure 11:
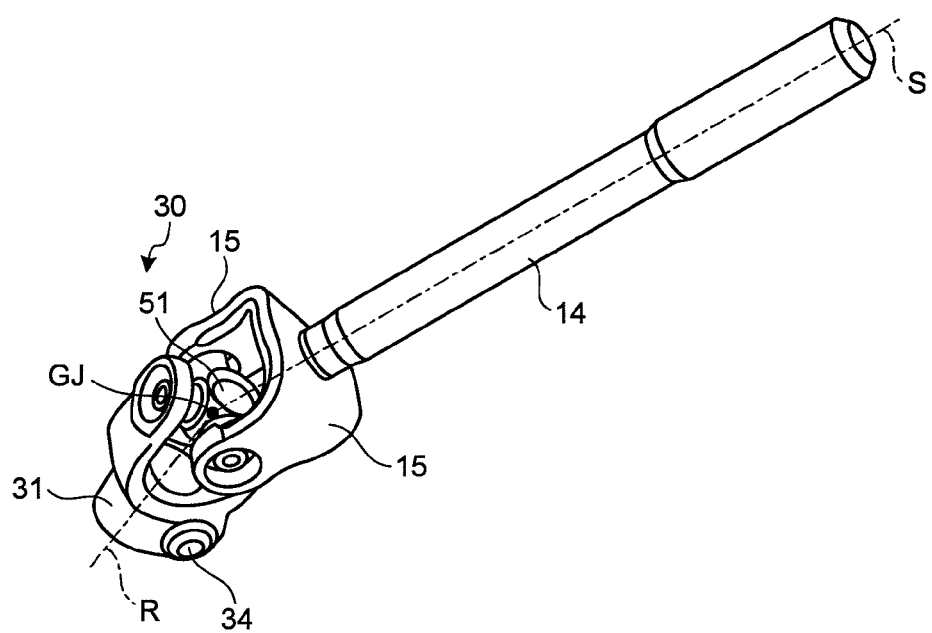
FIG. 11 is a diagram illustrating a relation between the pinion-side yoke and the cross shaft free joint excluding the bearing.

Next, the steering device of the embodiment will be described by referring to FIGS. 3 to 11. FIG. 3 is a diagram illustrating an example of a connection state between the universal joint and the intermediate shaft module. FIG. 4 is a diagram illustrating a slide tube yoke which is a component of the intermediate shaft module. FIG. 5 is a diagram illustrating a slide shaft yoke which is a component of the intermediate shaft module. FIG. 6 is a diagram illustrating a relation between the intermediate shaft module and a cross shaft free joint. FIG. 7 is a diagram illustrating an example of the cross shaft free joint used in the intermediate shaft module. FIG. 8 is a diagram illustrating a column yoke connected to a column output shaft. FIG. 9 is a diagram illustrating a pinion-side yoke. FIG. 10 is a diagram illustrating a relation between the cross shaft free joint and the pinion-side yoke connected to the pinion shaft. FIG. 11 is a diagram illustrating a relation between the pinion-side yoke and the cross shaft free joint.

As shown in FIG. 3, the intermediate shaft module 10 is disposed between a column yoke 21 connected to the column output shaft 120b of the steering shaft 120 and a pinion-side yoke 31 connected to the pinion shaft 60. The intermediate shaft module 10 includes the slide tube yoke 11 and the slide shaft yoke 14.

As shown in FIG. 4, one end of the slide tube yoke 11 is formed in a U-shape, and is provided with a pair of arm portions 12 and 12 opposite each other. The arm portions 12 and 12 are provided with a pair of bearing holes 13 and 13 respectively facing the arm portions 12 and 12. A swing axis STC connecting the hole centers of the bearing holes 13 and 13 is perpendicular to an axis ST which is the rotation center of the slide tube yoke 11. The intersection point between the swing axis STC and the axis ST is an intersection point HJs. The other end of the slide tube yoke 11 is connectable to the slide shaft yoke 14.

As shown in FIG. 5, one end of the slide shaft yoke 14 is formed in a U-shape, and is provided with a pair of arm portions 15 and 15 opposite each other. The arm portions 15 and 15 are provided with a pair of bearing holes 16 and 16 respectively facing the arm portions 15 and 15. A swing axis SSC connecting the hole centers of the bearing holes 15 and 15 is perpendicular to an axis SS which is the rotation center of the slide shaft yoke 14. The intersection point between the swing axis SSC and the axis SS is an intersection point GJs. The other end of the slide shaft yoke 14 is connectable to the slide tube yoke 11.

As shown in FIG. 6, the ends of the slide shaft yoke 14 and the slide tube yoke 11 mesh with each other. They mesh with each other, so that the axis ST corresponding to the rotation center of the slide tube yoke 11 shown in FIG. 4 matches with the axis SS corresponding to the rotation center of the slide shaft yoke 14 shown in FIG. 5, thereby forming the axis S corresponding to the rotation center of the intermediate shaft module 10 shown in FIG. 6. As shown in FIG. 6, a cross shaft free joint 41 and a cross shaft free joint 51 are combined with the intermediate shaft module 10.

As shown in FIG. 7, the cross shaft free joint 41 (51) is provided with joints 44 (54), 45 (55), 46 (56), and 47 (57) disposed at a body portion 43 (53) at the interval of 90°. The joint 44 (54) and the joint 45 (55) are coaxially disposed along the Y axis. The joint 46 (56) and the joint 47 (57) are coaxially disposed along the X axis. The intersection point O between the X and Y axes is the center of the cross shaft free joint 41 (51) and is the operation center of the free joint. Since the cross shaft free joint 51 is the same as the cross shaft free joint 41, the corresponding reference signs are shown in the round brackets, and the description thereof will not be repeated.

As shown in FIG. 6, the cross shaft free joint 41 is disposed between the pair of arm portions 12 and 12. Specifically, the joints 44 and 45 of the cross shaft free joint 41 are inserted into the bearing holes 13 and 13 through bearings to be described later. In the same manner, the cross shaft free joint 51 is disposed between the pair of arm portions 15 and 15. Specifically, the joints 54 and 55 of the cross shaft free joint 51 are inserted into the bearing holes 16 and 16 through bearings to be described later. The cross shaft free joint 41 is interposed so that the intersection point O of the cross shaft free joint 41 matches with the intersection point HJs of FIG. 4. The cross shaft free joint 51 is interposed so that the intersection point O of the cross shaft free joint 51 matches with the intersection point GJs of FIG. 5. The X axis of the cross shaft free joint 41 is disposed in a direction perpendicular to the column output shaft, and extends to the XH direction. The X axis of the cross shaft free joint 51 is disposed in a direction perpendicular to the pinion shaft, and extends to the XG direction.

As shown in FIG. 8, the end of the column yoke 21 connected to the column output shaft 120b of the steering shaft 120 is formed in a U-shape, and is provided with a pair of arm portions 22 and 22 opposite each other. The axis corresponding to the rotation center of the column output shaft 120b of the steering shaft 120 is the axis T. The arm portions 22 and 22 are provided with a pair of bearing holes 23 and 23 respectively facing the arm portions 22 and 22. An swing axis CJC connecting the hole centers of the bearing holes 23 and 23 is perpendicular to the axis T corresponding to the rotation center of the column yoke 21. The intersection point between the swing axis CJC and the axis T is an intersection point HJc. Furthermore, the column yoke 21 is provided with a pinch bolt hole 24 into which a pitch bolt is inserted so as to be attached to the column output shaft 120b.

Further, as shown in FIG. 9, the end of the pinion-side yoke 31 connected to the pinion shaft 60 is formed in a U-shape, and is provided with a pair of arm portions 32 and 32 opposite each other. The input axis corresponding to the rotation center of the steering gear is the axis R. The arm portions 32 and 32 are provided with a pair of bearing holes 33 and 33 respectively facing the arm portions 32 and 32. An swing axis GJC connecting the hole centers of the bearing holes 33 and 33 is perpendicular to the axis R corresponding to the rotation center of the pinion-side yoke 31. The intersection point between the swing axis GJC and the axis R is an intersection point GJg. Furthermore, the pinion-side yoke 31 is provided with a pinch bolt hole 34 into which a pinch bolt is inserted so as to be attached to the pinion shaft 60.

As shown in FIG. 10, the joints 46 and 47 of the cross shaft free joint 41 shown in FIG. 6 are inserted into the bearing holes 23 and 23 of the column yoke 21 shown in FIG. 8 through bearings to be described later. The cross shaft free joint 41 is interposed so that the intersection point O of the cross shaft free joint 41 matches with the intersection point HJc of FIG. 8. Therefore, the universal joint 20 is configured in which the joint angle between the intermediate shaft module 10 and the column output shaft 120b of the steering shaft 120 is changeable through the cross shaft free joint 41. As shown in FIG. 10, the intersection point O of the cross shaft free joint 41 matches with the intersection point HJs of FIG. 4 and the intersection point HJc of FIG. 8, and becomes the reference point HJ of the universal joint 20.

As shown in FIG. 11, the joints 56 and 57 of the cross shaft free joint 51 shown in FIG. 6 are inserted into the bearing holes 33 and 33 of the pinion-side yoke 31 shown in FIG. 9 through bearings to be described later. The cross shaft free joint 51 is interposed so that the intersection point O of the cross shaft free joint 51 matches with the intersection point GJg of FIG. 9. Therefore, as shown in FIG. 11, the universal joint 30 is configured in which the joint angle between the intermediate shaft module 10 and the pinion shaft 60 is changeable through the cross shaft free joint 51. As shown in FIG. 11, the intersection point 0 of the cross shaft free joint 51 matches with the intersection point GJs of FIG. 5 and the intersection point GJg of FIG. 9, and becomes the reference point GJ of the universal joint 30. The distance between the reference point HJ of the universal joint 20 and the reference point GJ of the universal joint 30 is described as a joint length W. The joint length W can be changed by changing the meshing position between the slide shaft yoke 14 and the slide tube yoke 11.

Figure 12A:
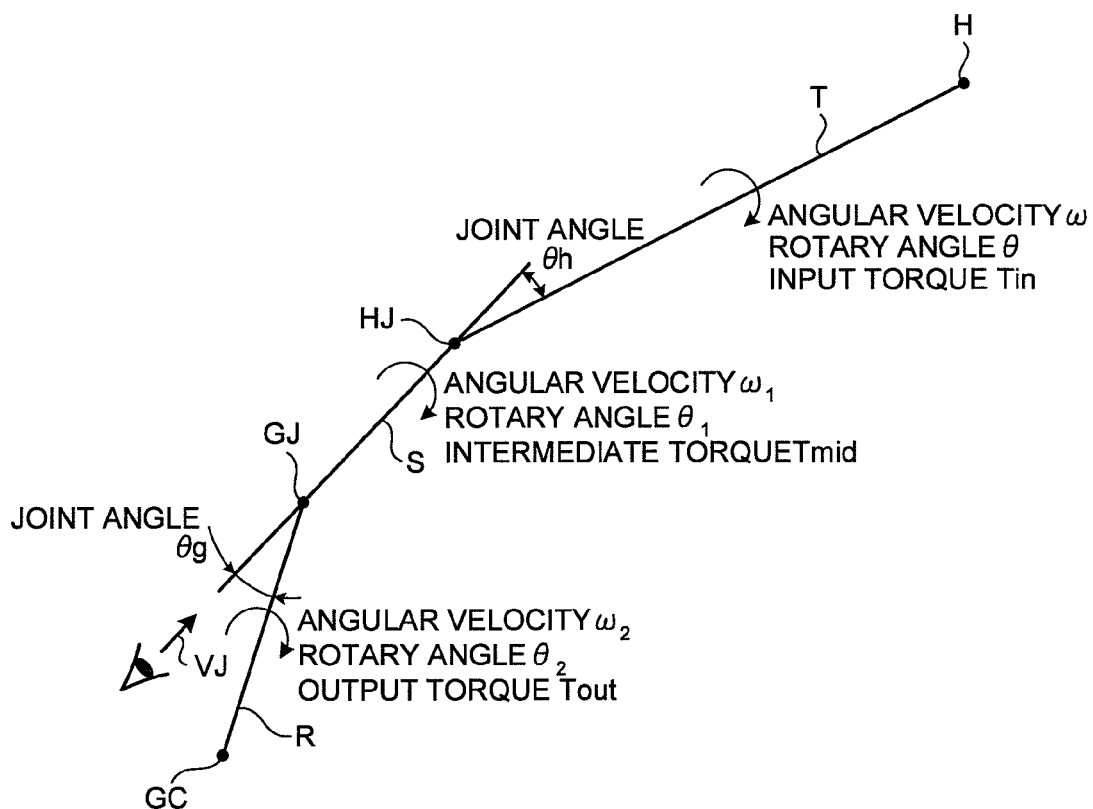
FIG. 12A is a diagram illustrating an example of an image in which four reference points are arranged in a three-dimensional space.
Figure 12B:
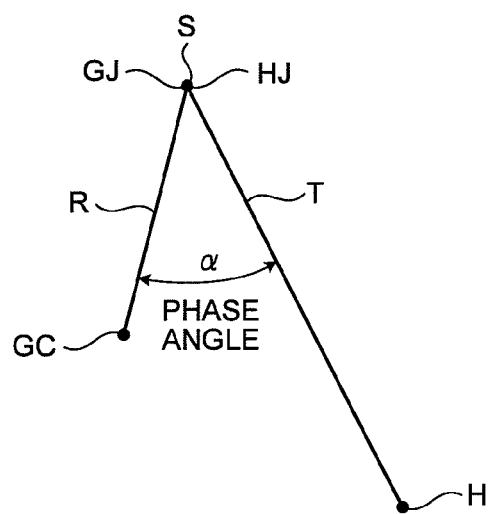
FIG. 12B is a diagram illustrating a projection plane when viewed in the direction indicated by an arrow VJ along a reference axis S in FIG. 12A (viewed along an axis GJ-HJ).

Next, referring to FIGS. 12A and 12B, the phase angle will be described. FIG. 12A is a diagram illustrating a relation between the axis R, the reference axis S, and the axis T by arranging the handle position reference point H, the reference point HJ of the universal joint 20, the reference point GJ of the universal joint 30, and the steering gear reference point GC in a three-dimensional space. In order to equalize the rotational angular velocity of the steering shaft with the rotational angular velocity of the pinion shaft, it is necessary to design so that the joint angle θh formed between the reference axis S and the axis T at the reference point HJ is equal to the joint angle θg formed between the reference axis S and the axis R at the reference point GJ. FIG. 12B is a diagram illustrating a projection plane when viewed in the direction indicated by the arrow VJ along the reference axis S in FIG. 12A (viewed along the axis GJ-HJ). The angle formed between the projection line of the axis R and the projection line of the axis T intersecting on the reference axis S becomes a phase angle α.

Figure 13:
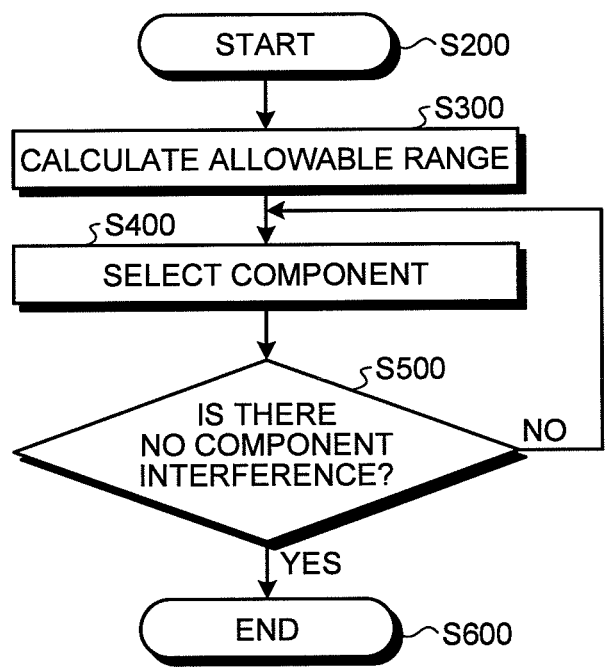
FIG. 13 is a flowchart illustrating a process procedure of the steering device design assisting apparatus.

FIG. 13 is a flowchart illustrating a process procedure of the steering device design assisting apparatus 1. The control device 4 of the steering device design assisting apparatus 1 starts the design of the steering mechanism 103 of the steering device 102 (step S200). In step S300, the design assisting apparatus 1 calculates the allowable range of the component of the steering mechanism 103 of the steering device 102 in the three-dimensional space. Next, in step S400, the design assisting apparatus 1 selects the component of the intermediate shaft module and the component of the universal joint on the basis of information of the determined reference point. Next, in step S500, when it is determined that the selected component interferes with the other components inside the vehicle 100, the design assisting apparatus 1 starts again the process procedure from before step S400. In step S500, when it is determined that the selected component does not interfere with the other components inside the vehicle 100, the steering device design assisting apparatus 1 ends the process (step S600).

Figure 14:
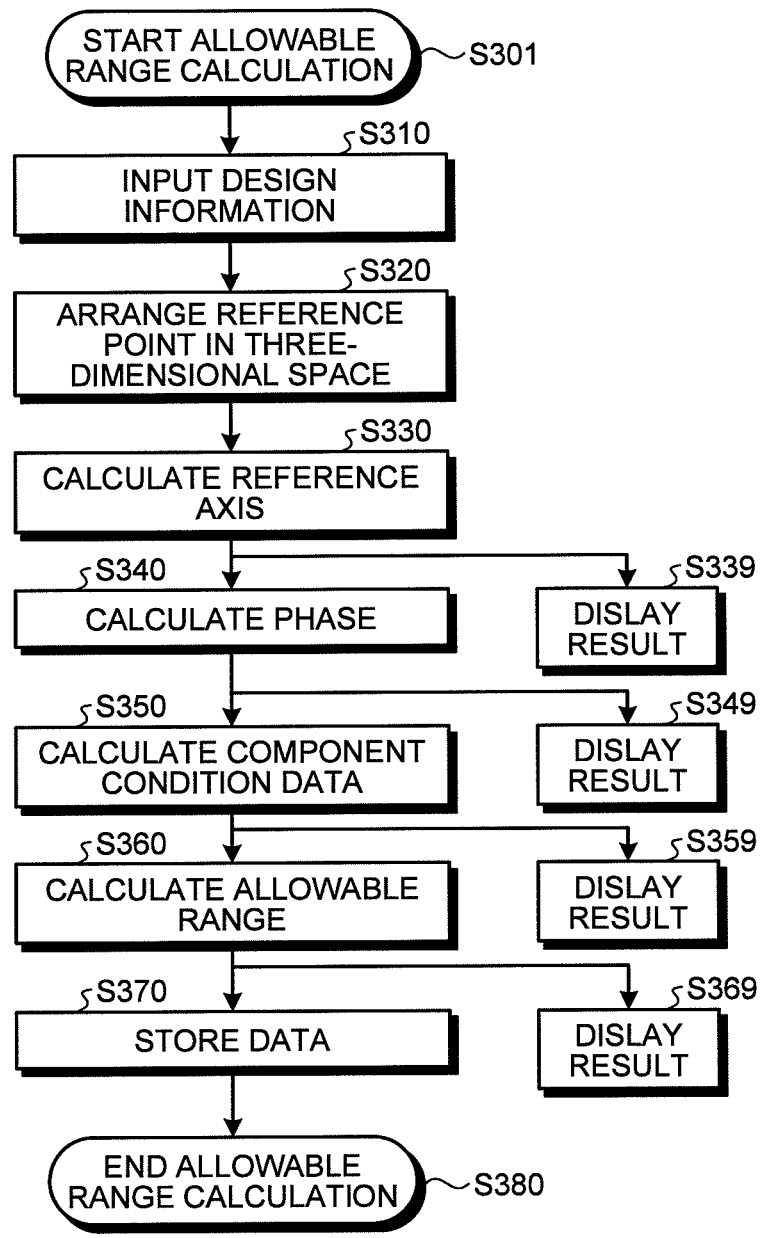
FIG. 14 is a flowchart specifically illustrating a process procedure of the steering device design assisting apparatus.

Next, referring to FIG. 14, the procedure of step S300 will be specifically described. The control device 4 of the steering device design assisting apparatus 1 starts the calculation of the allowable range of the component of the steering mechanism 103 (step S301). In the control device 4 of the steering device design assisting apparatus 1, design information of the vehicle is input from the input device 2. The design information is, for example, a limitation condition of the vehicle 100. The control device 4 of the design assisting apparatus 1 stores the input limitation condition of the vehicle in the external storage device 5 or the internal storage device 4f. The control device 4 of the design assisting apparatus 1 reads out the limitation condition of the vehicle stored in the external storage device 5 or the internal storage device 4f, and stores it in the RAM 4e (step S310). The design assisting apparatus 1 includes the external storage device 5, the internal storage device 4f, or the RAM 4e as a storage unit. The control device 4 of the design assisting apparatus 1 may directly store the input limitation condition of the vehicle in the RAM 4e. For example, the limitation condition of the vehicle 100 includes four reference points (customer specification), that is, the handle position reference point H, the reference point HJ of the universal joint 20 as a first joint reference point, the reference point GJ of the universal joint 30 as the second joint reference point, and a steering gear reference point GC. In the control device 4 of the steering device design assisting apparatus 1, the respective coordinates of four reference points, that is, the handle position reference point H, the reference point HJ of the universal joint 20, the reference point GJ of the universal joint 30, and the steering gear reference point GC are input from the input device 2, and are stored in the RAM 4e. The control device 4 of the steering device design assisting apparatus 1 displays respective coordinates of four reference points on a design information input screen using the display device 3.

FIG. 15 is a diagram illustrating an example of the design information input screen. In a design information input screen 500 shown in FIG. 15, an input box for accepting input of the handle position reference point H (the X coordinate, the Y coordinate, and the Z coordinate) as the handle original point, an input box for accepting input of the reference point HJ (the X coordinate, the Y coordinate, and the Z coordinate) of the universal joint 20 as the handle-side joint point, an input box for accepting input the reference point GJ (the X coordinate, the Y coordinate, and the Z coordinate) of the universal joint 30 as the gear-side joint point, and an input box for accepting input the steering gear reference point GC (the X coordinate, the Y coordinate, and the Z coordinate) as the gear intersection point are displayed. A designer inputs the coordinates (the X coordinate, the Y coordinate, and the Z coordinate) of the four reference points into the respective input boxes. The control device 4 of the steering device design assisting apparatus 1 stores the coordinates of four reference points input to the respective input boxes in the RAM 4e. Then, the control device 4 of the steering device design assisting apparatus 1 stores the coordinates of the four reference points in the external storage device 5 or the internal storage device 4f. When the coordinates of the four reference points are stored in advance in the external storage device 5 or the internal storage device 4f, the control device 4 of the steering device design assisting apparatus 1 may read out the stored coordinates of the four reference points and store the coordinates in the RAM 4e.

Figures 17, 18:
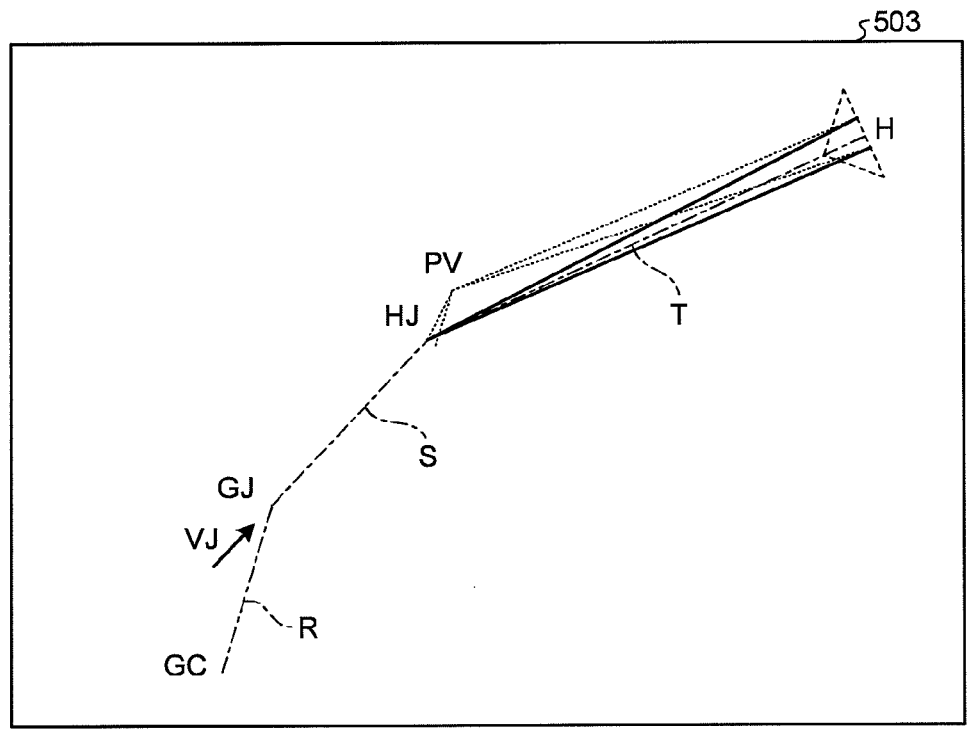
FIG. 17 is a diagram illustrating an example of a tilt coordinate display screen.
FIG. 18 is a diagram illustrating an example of an output display screen 503 of the reference axis and the reference points arranged in the three-dimensional space.

The steering device 102 of the present embodiment is provided with the tilting mechanism and the telescopic (hereinafter, referred to as telesco) mechanism. FIG. 16 is a diagram illustrating an example of the design information input screen of tilt and telesco information as another design information input screen. The design information input screen 501 shown in FIG. 16, an input box for accepting input of a distance from the handle position reference point H, an input box for accepting input of a distance (height) from the column output shaft, an input box for accepting input of a tilt amount (a tilt UP amount and a tilt DOWN amount), and an input box for accepting input of a telescopic amount (a telesco contraction amount and a telesco expansion amount) are displayed. The information accepted in the design information input screen of the tilt and telesco information is stored in the external storage device 5 or the internal storage device 4f. The control device 4 of the steering device design assisting apparatus 1 reads out four reference points accepted in the design information input screen 500 shown in FIG. 15 and the tilt and telesco information accepted in the design information input screen of the tilt and telesco information to the RAM 4e, and calculates the tilt UP coordinate data and the tilt DOWN coordinate data using the CPU 4c. FIG. 17 is a tilt coordinate display screen 502 illustrating an example of the tilt UP coordinate data and the tilt DOWN coordinate data displayed on the display device 3 by the control device 4 of the steering device design assisting apparatus 1.

Next, as shown in FIG. 14, the control device 4 of the steering device design assisting apparatus 1 starts the calculation of the allowable range (step S310), and arranges the reference points in the three-dimensional space where the longitudinal, vertical, and lateral directions of the vehicle are defined (step S320). As shown in FIG. 18, the control device 4 arranges the handle position reference point H, the reference point HJ of the universal joint 20, the reference point GJ of the universal joint 30, and the steering gear reference point GC in the three-dimensional space, and displays the spatial arrangement of four reference points on the display device 3. In the drawing of FIG. 18, PV denotes a Pivot point (tilt point) corresponding to a support point of the tilt operation.

Next, as shown in FIG. 14, the control device 4 of the steering device design assisting apparatus 1 calculates the reference axis connecting the reference points arranged in the three-dimensional space (step S330). FIG. 18 is a diagram illustrating an example of an output display screen 503 of the reference axis and the reference points arranged in the three-dimensional space. The CPU 4c of the control device 4 serves as a reference axis calculation unit, and calculates the axis T connecting the handle position reference point H and the reference point HJ of the universal joint 20, the reference axis S connecting the reference point HJ of the universal joint 20 and the reference point GJ of the universal joint 30, and the axis R connecting the reference point GJ of the universal joint 30 and the steering gear reference point GC in the three-dimensional space. The control device 4 of the steering device design assisting apparatus 1 outputs the axis T, the reference axis S, and the axis R to the display device 3 (step S339).

The CPU 4c of the control device 4 of the steering device design assisting apparatus 1 serves as a phase angle calculation unit, and calculates an angle, that is, a so-called phase angle α formed between the projection line of the axis T and the projection line of the axis R intersecting on the reference axis S in the projection plane (joint plane) when viewed along the reference axis S (viewed along the axis GJ-HJ) in the direction indicated by the arrow VJ along the reference axis S of FIG. 18 (step S340). The control device 4 of the steering device design assisting apparatus 1 outputs the calculation result of the phase angle α to the display device 3 (step S349). FIG. 19 is a diagram illustrating an example of an output display screen 504 displaying the calculation result of the phase angle α. The output display screen 504 includes a phase angle calculation value display screen 505 displaying the calculation value of the phase angle α and an angle drawing screen 506 drawing the phase angle α in the joint plane.

Next, the control device 4 of the steering device design assisting apparatus 1 calculates the component condition data on the basis of four reference points, the axis T, the reference axis S, and the axis R (step S350). The control device 4 of the design assisting apparatus 1 of the steering device outputs the calculation result of the component condition data to the display device 3 (step S359). FIG. 20 is a diagram illustrating an example of the output display screen 504 displaying the calculation result of the component condition. The output display screen 504 includes a component condition data table 507 displaying the calculation value of the component condition data. The CPU 4c of the control device 4 stores the component condition data in the external storage device 5 or the internal storage device 4f.

Figure 21:
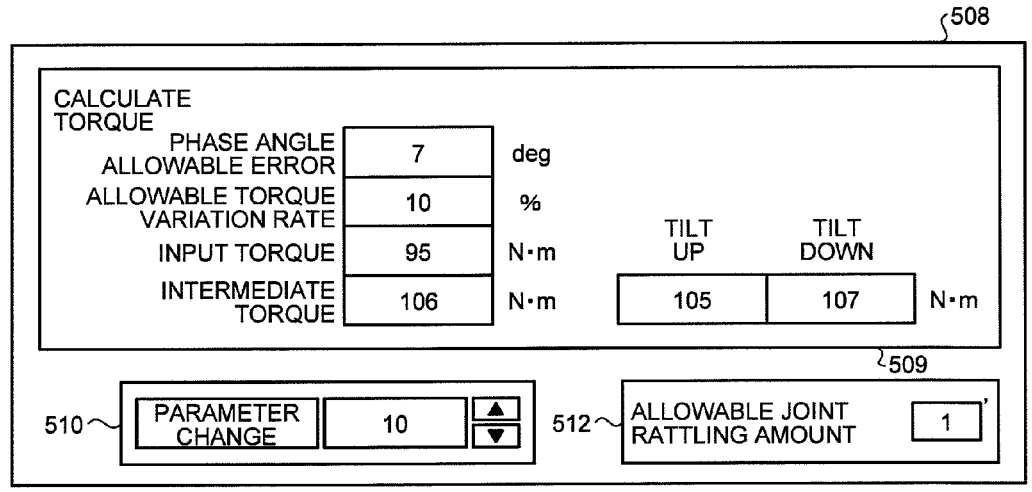
FIG. 21 is a diagram illustrating an example of an input display screen displaying a torque calculation condition.

Next, as shown in FIG. 14, the control device 4 of the steering device design assisting apparatus 1 calculates the allowable range of the component of the steering mechanism 103 (step S360). FIG. 21 is a diagram illustrating an example of an input display screen displaying the torque calculation condition. In the CPU 4c of the control device 4, a torque calculation condition 509 of the input screen 508 shown in FIG. 21 is input from the input device 2 through the input interface 4a. The input torque calculation condition 509 includes information on a phase angle allowable error, an allowable torque variation rate, an input torque, an intermediate torque (a torque between the joints at the middle-stage tilt), and an intermediate torque (a torque between the joints) at the times of the tilt UP and the tilt DOWN. In the CPU 4c, an allowable joint rattling condition 512 of the input screen 508, for example, one minute (') is input from the input device 2 through the input interface 4a. The allowable joint rattling condition 512 is determined by the environmental condition of the vehicle. The phase angle allowable error is a range of a phase angle deviation caused by a manufacturing error. The torque variation rate is a variation of torque when steering the vehicle. When the torque variation rate is large, a steering sensation of the handle is affected. Therefore, it is desirable that the torque variation rate be small. The control device 4 of the design assisting apparatus 1 stores the input torque calculation condition 509 and the allowable joint rattling condition 512 in the external storage device 5 or the internal storage device 4f. The control device 4 of the design assisting apparatus 1 reads out the stored torque calculation condition 509 from the external storage device 5 or the internal storage device 4f, and stores the condition in the RAM 4e. The control device 4 of the design assisting apparatus 1 may directly store the input torque calculation condition 509 in the RAM 4e. The calculation condition of a torque variation rate-phase angle curve is detected on the basis of the torque calculation condition. Hereinafter, the calculation of the torque variation rate will be described.

As shown in FIG. 12A, the angular velocity on the axis T is denoted by ω, the rotary angle on the axis T is denoted by θ, the input torque on the axis T is denoted by Tin, the angular velocity on the axis S is denoted by $\omega_1$, the rotary angle on the axis S is denoted by $\theta_1$, the intermediate torque on the axis S is denoted by Tmid, the angular velocity on the axis R is denoted by $\omega_2$, the rotary angle on the axis R is denoted by $\theta_2$, the intermediate torque on the axis R is denoted by Tout, and the joint angles are denoted by θh and θg. The rotary angle $\theta_1$ on the axis S is expressed by Equation (1).

Equation 1

$$\theta_1 = \tan^{-1}(\tan\theta \cos\theta h) \quad (1)$$

When the angular velocity is calculated by differentiating both sides of Equation (1) with respect to time, Equation (2) is derived.

Equation 2

$$\omega_1 = \frac{\cos(\theta h)}{1 - \sin^2\theta h \sin^2\theta} \omega \quad (2)$$

In the same manner, when the angular velocity $\omega_2$ on the axis R is calculated, Equation (3) is derived.

Equation 3

$$\omega_2 = \frac{\cos(\theta g)}{1-\sin^2\theta g \sin^2\theta_2}\omega_1 \qquad (3)$$
$$= \left(\frac{\cos(\theta g)}{1-\sin^2\theta g \sin^2\theta_2}\right)\left(\frac{\cos(\theta h)}{1-\sin^2\theta h \sin^2\theta}\omega\right)$$

Therefore, the angular velocity ratio Rate between the axis R as the output axis and the axis T as the input axis becomes the following Equation (4).

Equation 4

$$\text{Rate} = \frac{\omega_2}{\omega} = \frac{\left(\frac{\cos(\theta g)}{1-\sin^2\theta g \sin^2\theta_2}\right)\left(\frac{\cos(\theta h)}{1-\sin^2\theta h \sin^2\theta}\omega\right)}{\omega} \qquad (4)$$
$$= \left(\frac{\cos(\theta g)}{1-\sin^2\theta g \sin^2\theta_2}\right)\left(\frac{\cos(\theta h)}{1-\sin^2\theta h \sin^2\theta}\right)$$

The torque variation rate (%) is a ratio between the input torque Tin and the output torque Tout, and this ratio is the inverse number of the angular velocity ratio. Therefore, the torque variation rate Tr is expressed by Equation (5).

Equation 5

$$Tr = \frac{\text{Tout}}{\text{Tin}} = \frac{1}{\text{Rate}} \qquad (5)$$

In Equation (5), $\theta_2$ is expressed by Equation (6). For this reason, the torque variation rate (%) becomes a function of the phase angle $\alpha$.

Equation 6

$$\theta_2 = \theta_1 - \frac{1}{2}\pi\alpha \qquad (6)$$

The CPU 4c of the control device 4 calculates the torque variation rate-phase angle curve on the basis of the calculation condition, using Equation (5) and Equation (6) above.

Figure 22:
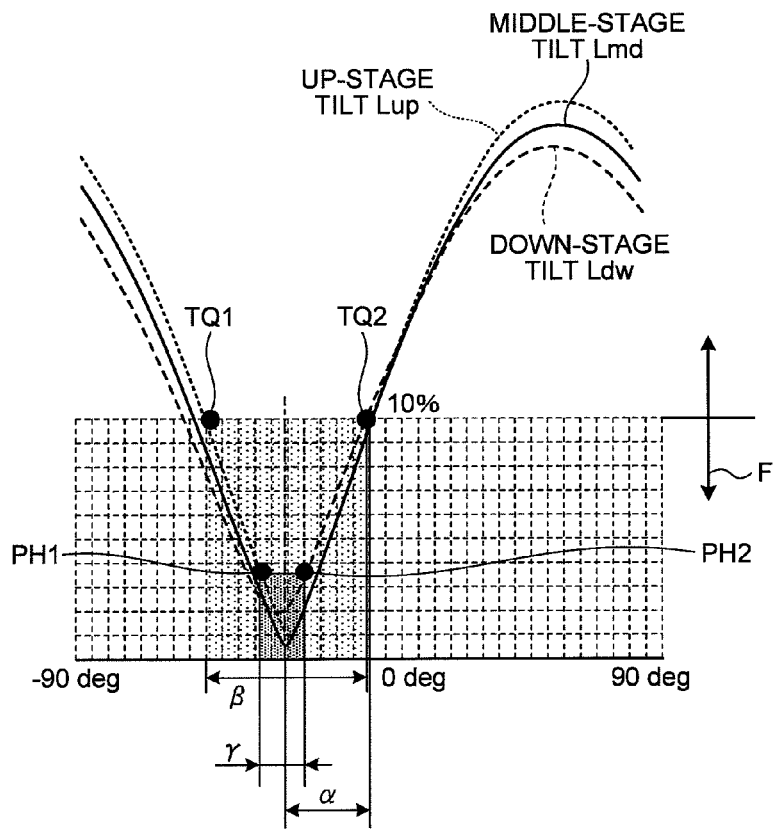
FIG. 22 is a diagram illustrating an example of an output display screen describing a torque variation rate-phase angle curve.

FIG. 22 is a diagram illustrating an example of an output display screen illustrating the torque variation rate-phase angle curve. In FIG. 22, the torque variation rate-phase angle curve is displayed, where the vertical axis indicates the torque variation rate and the horizontal axis indicates the phase angle. The torque variation rate-phase angle curves Lup, Lmd, and Ldw of the up-stage tilt, the middle-stage tilt, and the down-stage tilt are calculated by the CPU 4c of the control device 4. In this example, in the torque variation rate-phase angle curve Lmd of the middle-stage tilt, the torque variation rate becomes minimal when the phase angle is α. As shown in FIG. 22, among values of the torque variation rate-phase angle curve Lup, Lmd, and Ldw of the up-stage tilt, the middle-stage tilt, and the down-stage tilt when the allowable torque variation rate is, for example, 10%, the values of the phase angles closest to the phase angle α are defined as TQl and TQ2, and the range of the phase angle from TQl to TQ2 is defined as the allowable range β. The range of the phase angle deviation caused by the manufacturing error is defined as the allowable range γ. The minimum value and the maximum value of the most deviation phase angle within the allowable range γ when the phase angle is α, are given to the torque variation rate-phase angle curves Lup, Lmd, and Ldw of the up-stage tilt, the middle-stage tilt, and the down-stage tilt. Then, points having the largest torque variation rate value are defined as PH1 and PH2. The designer may be assisted the design considering the tilt operation by taking the up-stage tilt, the middle-stage tilt, and the down-stage tilt into consideration. For example, in a mass production component of the intermediate shaft module 10 having, for example, 10% of the allowable torque variation rate, when the allowable range γ is given as the range of the phase angle deviation caused by the manufacturing error of the mass production component, the allowable range γ is set to the phase angle α±7°. In this case, when the minimum phase angle α−7° and the maximum phase angle a+7° of the phase angle are given to the torque variation rate-phase angle curves Lup, Lmd, and Ldw of the up-stage tilt, the middle-stage tilt, and the down-stage tilt, it is found that the torque variation rate of PH1 and PH2 indicating the value of the largest torque variation rate is smaller than the allowable torque variation rate, for example, 10%. Further, among values of the torque variation rate-phase angle curve Lup, Lmd, and Ldw of the up-stage tilt, the middle-stage tilt, and the down-stage tilt when the allowable torque variation rate is, for example, 10%, when the values of the phase angles closest to the phase angle α are defined as TQl and TQ2 and the range of the phase angle from TQl to TQ2 is defined as the allowable range β, the allowable range β includes the range of the phase angle α±7° as the allowable range γ. Therefore, the allowable range of the phase angle allowable error is included in the allowable range of the allowable torque variation rate. Furthermore, in the input torque calculation condition 509 shown in FIG. 21, when the value of the allowable torque variation rate (the torque variation rate value) is changed, the upper-limit line (the line passing through TQl and TQ2) moves up and down along, for example, the direction indicated by the arrow F shown in FIG. 22.

The CPU 4c of the control device 4 detects whether the phase angle allowable error and the allowable torque variation rate are input from the input device 2 as the input unit to the input screen 508 shown in FIG. 21 through the input interface 4a. The CPU 4c of the control device 4 detects an input value directly input by the designer, as shown in, for example, the input and output screen 508 shown in FIG. 21. The CPU 4c of the control device 4 stores the values of the phase angle allowable error and the allowable torque variation rate in the external storage device 5 or the internal storage device 4f. The CPU 4c of the control device 4 reads out the stored phase angle allowable error and the stored allowable torque variation rate from the external storage device 5 or the internal storage device 4f, and stores those in the RAM 4e. The CPU 4c of the control device 4 may directly store the values of the input phase angle allowable error and the input allowable torque variation rate in the RAM 4e.

The CPU 4c of the control device 4 may detect, for example, the input of the up and down change values in the direction indicated by the arrow of the phase angle allowable error or the allowable torque variation rate on a parameter change screen 510. The CPU 4c of the control device 4 stores the input values of the phase angle allowable error or the allowable torque variation rate in the external storage device 5 or the internal storage device 4f. The CPU 4c of the control device 4 reads out the stored phase angle allowable error and the stored allowable torque variation rate from the external storage device 5 or the internal storage device 4f, and stores those in the RAM 4e. When at least one of the allowable torque variation rate and the phase angle allowable error is changed, the CPU 4c of the control device 4 calculates at least one of the allowable range β of the allowable torque variation rate on the basis of the changed allowable torque variation rate and the allowable range γ of the phase angle allowable error on the basis of the changed phase angle allowable error. The CPU 4c of the control device 4 allows the display device 3 as the display unit to simultaneously display the allowable range β of the allowable torque variation rate and the allowable range γ of the phase angle allowable error.

When the initial values of the allowable torque variation rate and the phase angle allowable error are given to the external storage device 5 or the internal storage device 4f, the CPU 4c of the control device 4 may directly store the values of the phase angle allowable error and the allowable torque variation rate increasing and decreasing by a predetermined range from the initial value in the RAM 4e.

Figure 23:
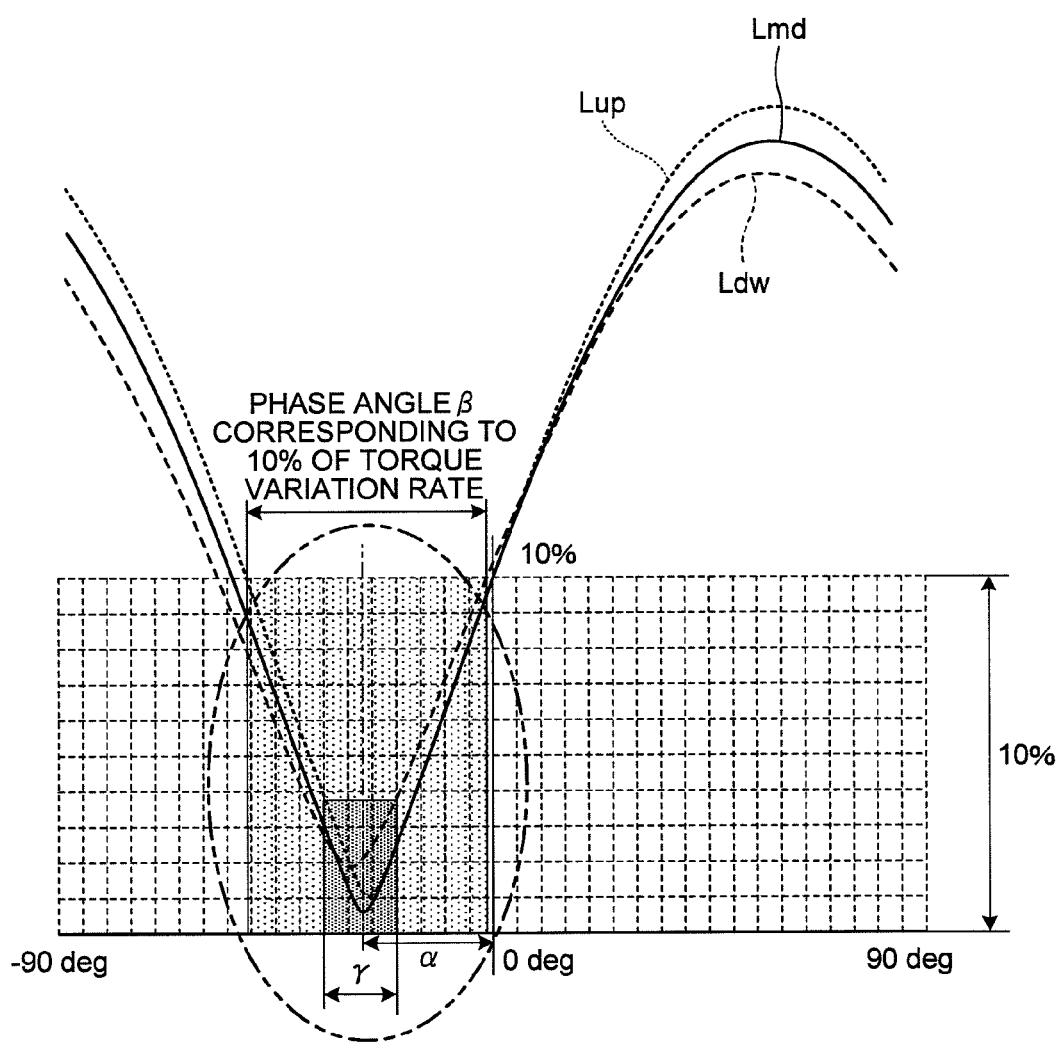
FIG. 23 is a diagram illustrating an example of an output display screen describing a torque variation rate-phase angle curve at a predetermined condition.
Figure 24:
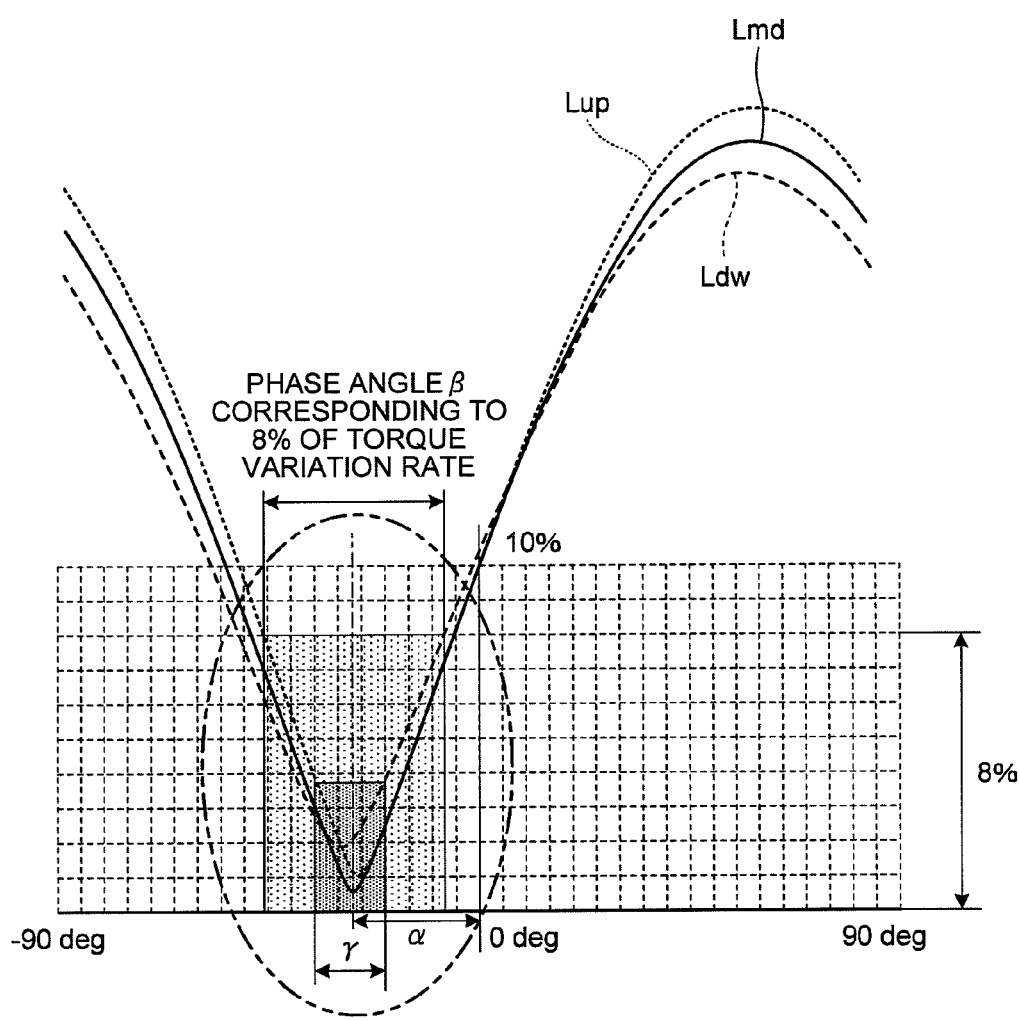
FIG. 24 is a diagram illustrating an example of an output display screen describing a torque variation rate-phase angle curve at a predetermined condition.
Figure 25:
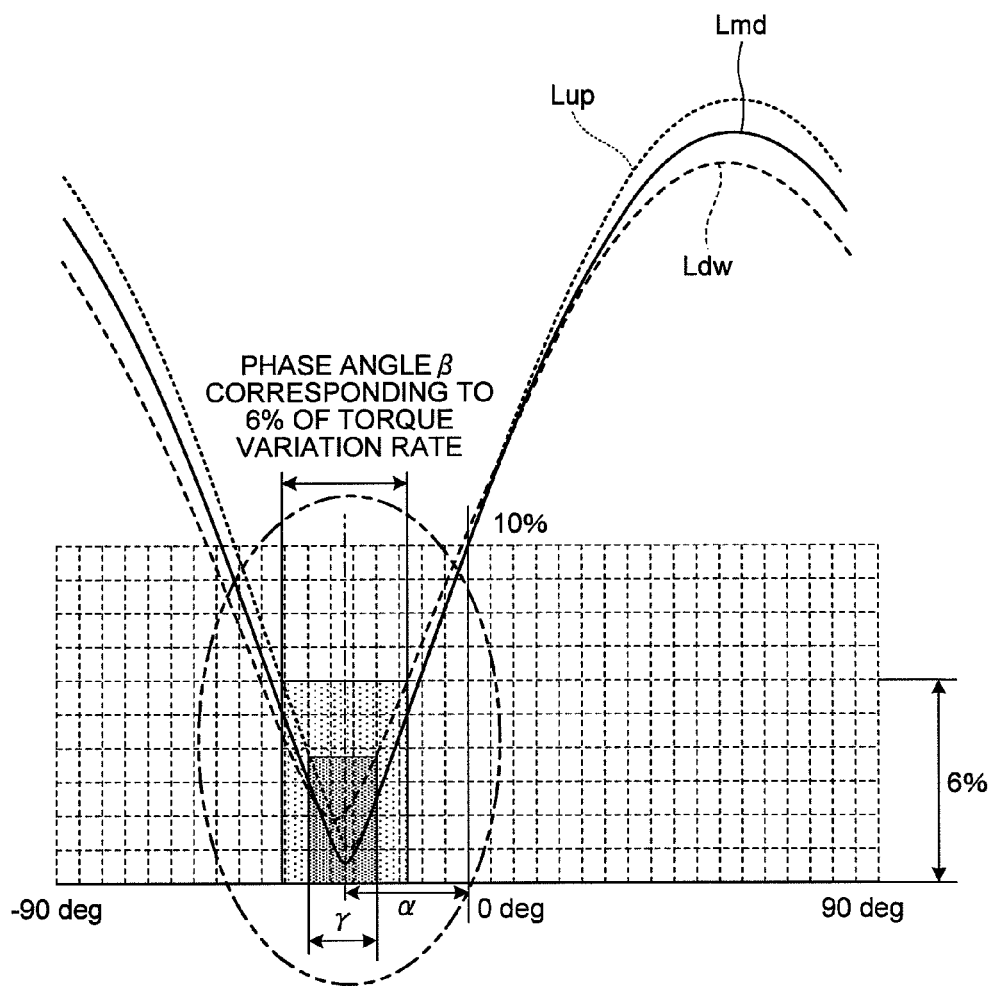
FIG. 25 is a diagram illustrating an example of an output display screen describing a torque variation rate-phase angle curve at a predetermined condition.
Figure 26:
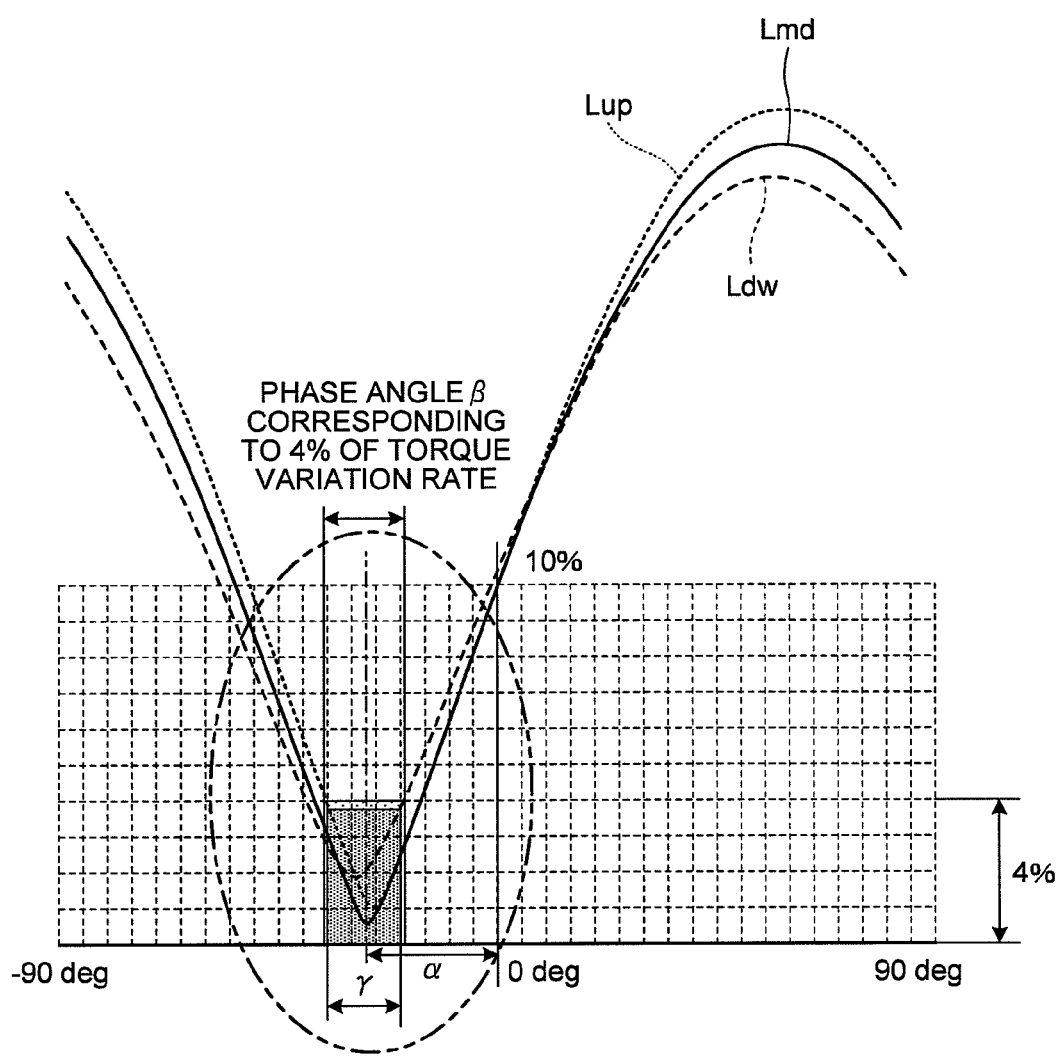
FIG. 26 is a diagram illustrating an example of an output display screen describing a torque variation rate-phase angle curve at a predetermined condition.
Figure 27:
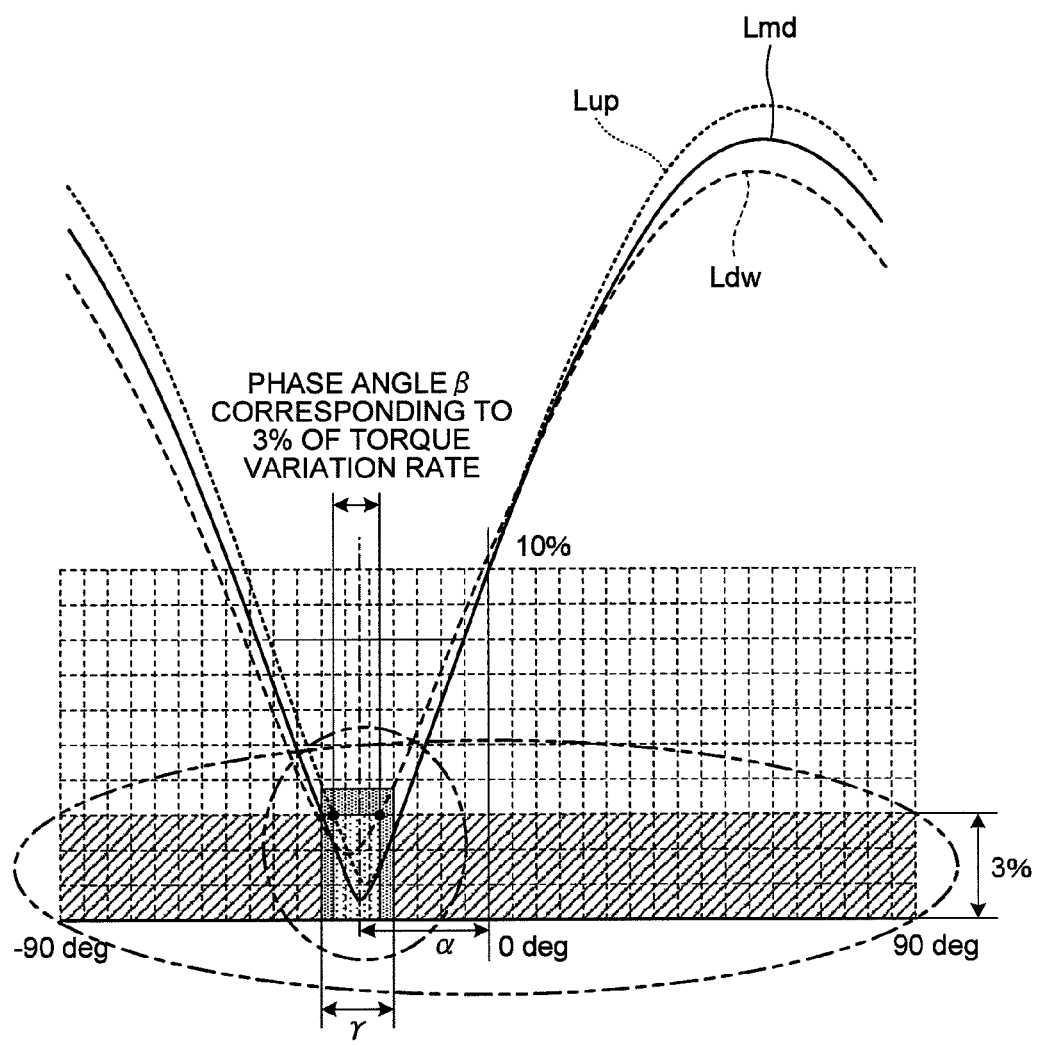
FIG. 27 is a diagram illustrating an example of an output display screen describing a torque variation rate-phase angle curve at a predetermined condition.

FIGS. 23 to 27 are examples of a display screen comparing a magnitude relation of the allowable range of the allowable torque variation rate and the allowable range of the phase angle allowable error, in the case of changing the torque variation rate from 10% to 3% when the allowable range γ is set to α±7° (step S369). FIG. 23 is the allowable range of the allowable torque variation rate in the phase angle β corresponding to 10% of the torque variation rate. The allowable range γ is the allowable range of the phase angle allowable error, and is α±7°. FIG. 24 is the allowable range of the allowable torque variation rate in the phase angle β corresponding to 8% of the torque variation rate. The allowable range γ is the allowable range of the phase angle allowable error, and is α±7°. FIG. 25 is the allowable range of the allowable torque variation rate in the phase angle β corresponding to 6% of the torque variation rate. The allowable range γ is the allowable range of the phase angle allowable error, and is α±7°. FIG. 26 is the allowable range of the allowable torque variation rate in the phase angle β corresponding to 4% of the torque variation rate. The allowable range γ is the allowable range of the phase angle allowable error, and is α±7°. FIG. 27 is the allowable range of the allowable torque variation rate in the phase angle β corresponding to 3% of the torque variation rate. The allowable range γ is the allowable range of the phase angle allowable error, and is α±7°.

As shown in FIGS. 23 to 26, the allowable range β corresponding to 10% to 4% of the torque variation rate includes the allowable range γ. Therefore, when the torque variation rate is from 10% to 4%, the relation of allowable range β>allowable range γ is established. However, as shown in FIG. 27, when the torque variation rate is 3%, the allowable range β may not include α±7° as the allowable range γ. Therefore, when the torque variation rate is 3%, the relation of allowable range β>allowable range γ is not established. In FIG. 27, the non-established state is highlighted by the shaded portion in order to clearly show the non-established state. The designer can obviously recognize the condition is not established. It may be highlighted whether the magnitude relation between the allowable range β and the allowable range γ is established, in the manner that the established state is displayed in green and the non-established state is displayed in red, and so on. When the torque variation rate is changed from 10% to 3% on the parameter change screen 510 for detecting the input of the up and down change values, the display screen of the display device 3 continuously changes as shown in FIGS. 23 to 27, and thereby, the designer can obviously recognize the non-established state without reading numerical values or the like. The display screen continuously changes in accordance with the changed allowable torque variation rate, and the steering device design assisting apparatus 1 can assist the designer to intuitively understand.

Figure 28:
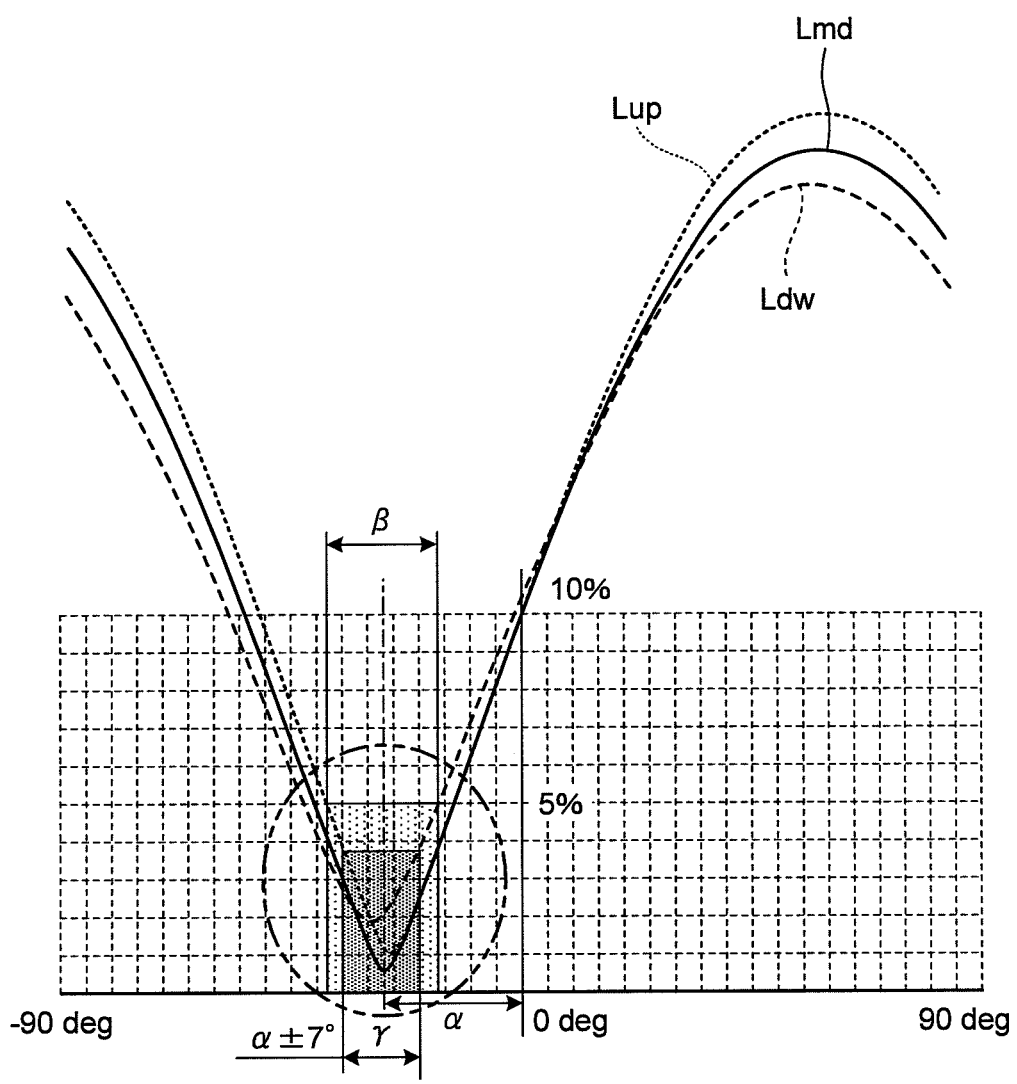
FIG. 28 is a diagram illustrating an example of an output display screen describing a torque variation rate-phase angle curve at a predetermined condition.
Figure 29:
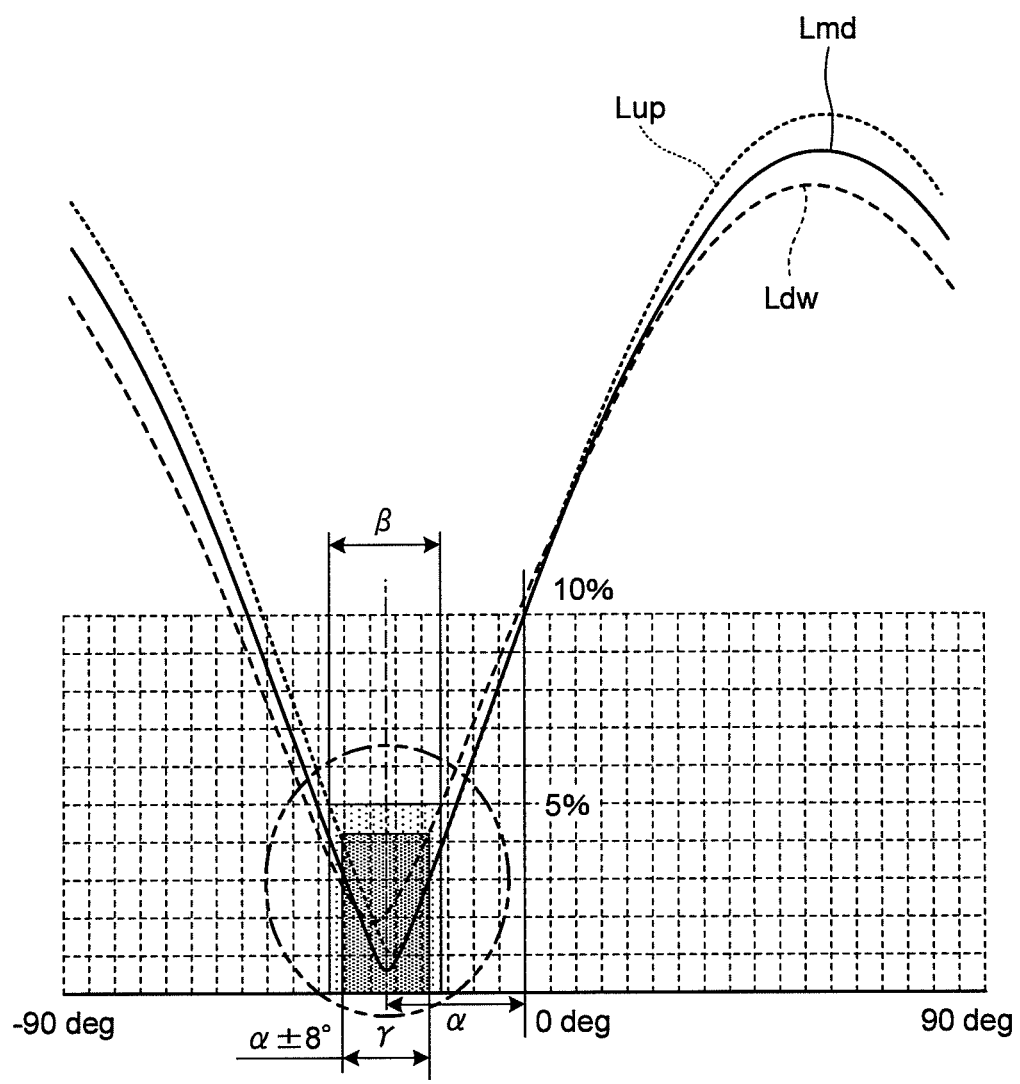
FIG. 29 is a diagram illustrating an example of an output display screen describing a torque variation rate-phase angle curve at a predetermined condition.
Figure 30:
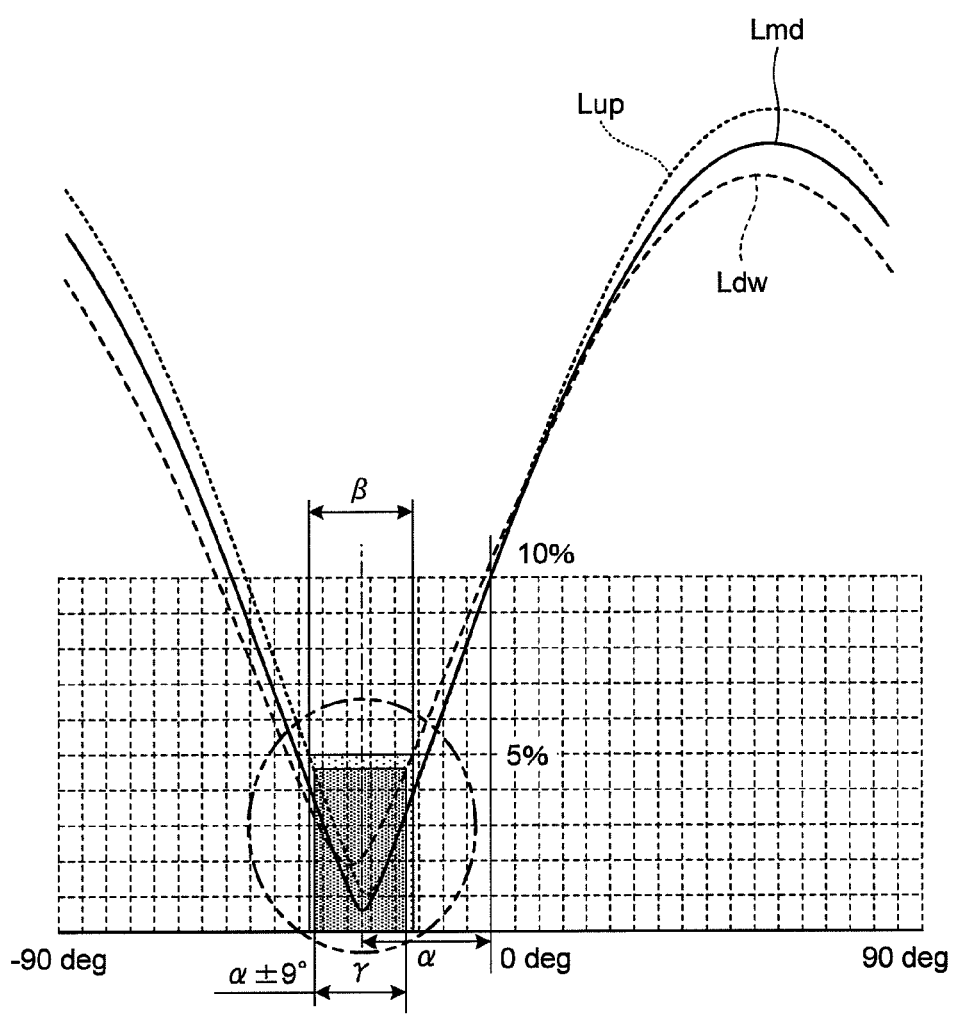
FIG. 30 is a diagram illustrating an example of an output display screen describing a torque variation rate-phase angle curve at a predetermined condition.
Figure 31:
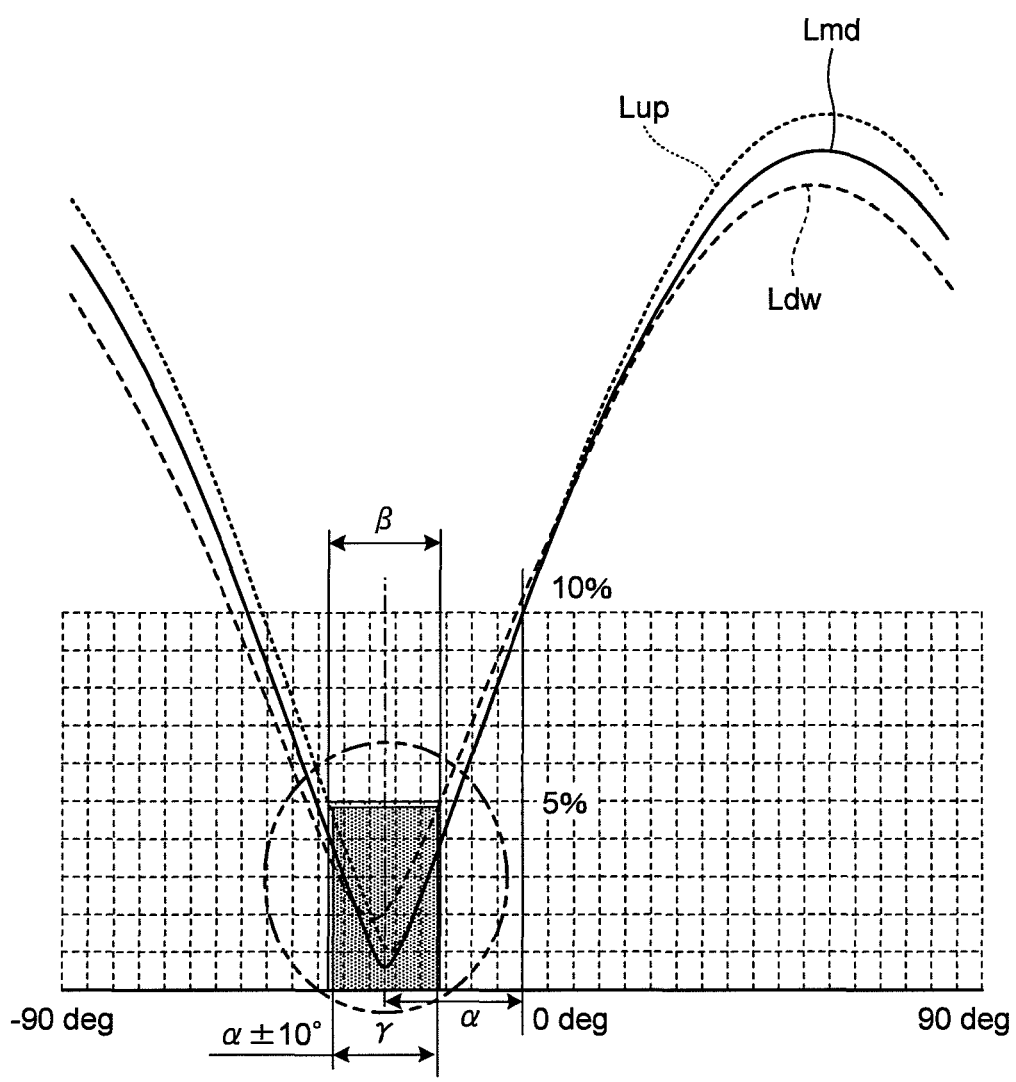
FIG. 31 is a diagram illustrating an example of an output display screen describing a torque variation rate-phase angle curve at a predetermined condition.
Figure 32:
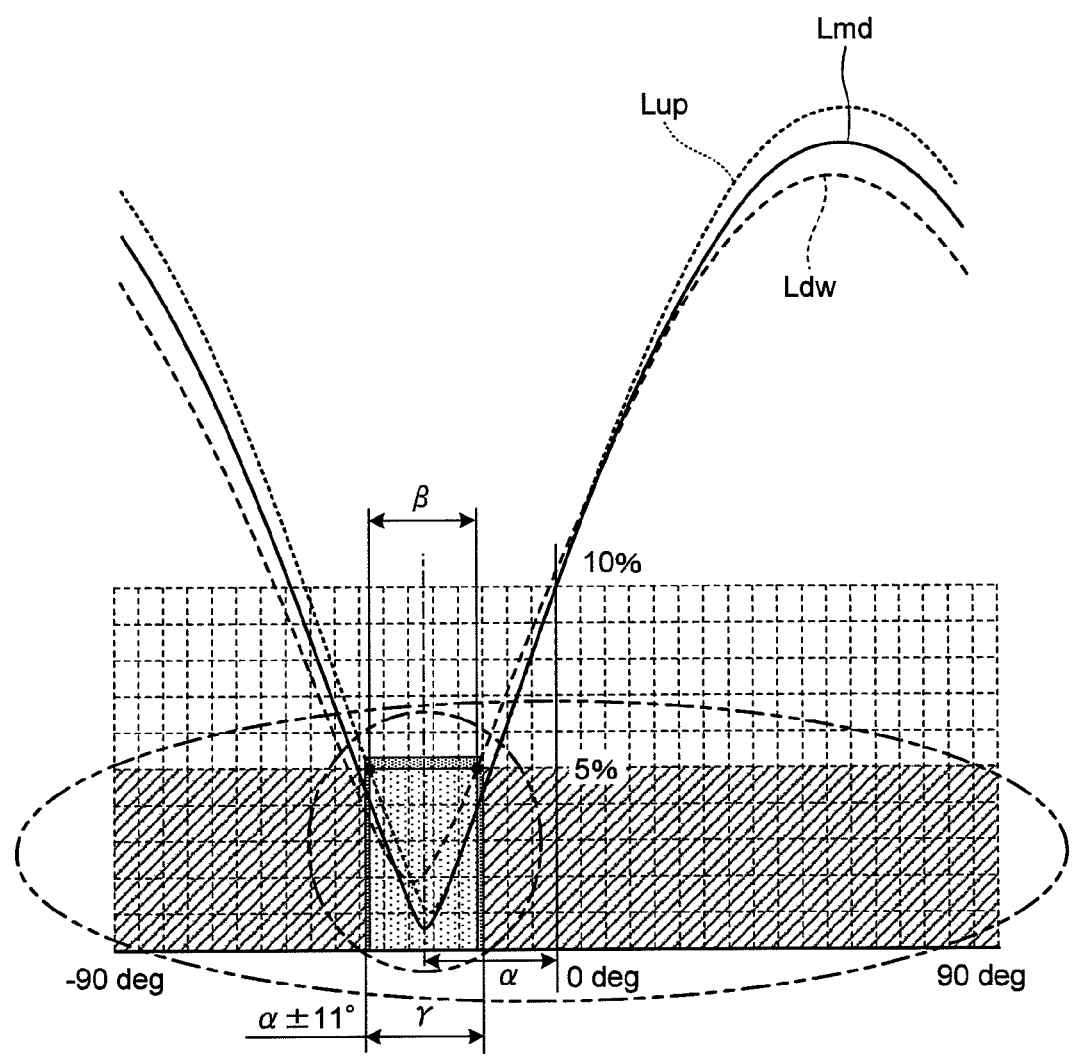
FIG. 32 is a diagram illustrating an example of an output display screen describing a torque variation rate-phase angle curve at a predetermined condition.

Next, FIGS. 28 to 32 are examples of the display screen comparing a magnitude relation between the allowable range γ and the allowable range β of the phase angle corresponding to 5% of the torque variation rate, in the case of changing the allowable range of the phase angle allowable error γ from α±7° to α±11° when the torque variation rate is set to 5% (step S369). FIG. 28 illustrates a magnitude relation between the allowable range β and the allowable range γ when the torque variation rate is 5% and the allowable range γ is α±7°. FIG. 29 illustrates a magnitude relation between the allowable range β and the allowable range γ when the torque variation rate is 5% and the allowable range γ is α±8°. FIG. 30 illustrates a magnitude relation between the allowable range β and the allowable range γ when the torque variation rate is 5% and the allowable range γ is α±9°. FIG. 31 illustrates a magnitude relation between the allowable range β and the allowable range γ when the torque variation rate is 5% and the allowable range γ is α±10°. FIG. 32 illustrates a magnitude relation between the allowable range β and the allowable range γ when the torque variation rate is 5% and the allowable range γ is α±11°.

As shown in FIGS. 28 to 31, when the torque variation rate is 5% and the allowable range γ is from α±7° to α±10°, the relation of allowable range β>allowable range γ is established, and thereby, the range of the allowable range γ is included in the range of the allowable range β. Therefore, when the torque variation rate is 5% and the allowable range γ is from α±7° to α±10°, the relation of allowable range β>allowable range γ is established. As shown in FIG. 32, when the torque variation rate is 5% and the allowable range γ is α±11°, the relation of allowable range p<allowable range γ is established, and thereby, the range of the allowable range γ is not included in the range of the allowable range β. Therefore, When the torque variation rate is 5% and the allowable range γ is α±11°, the relation of allowable range β>allowable range γ is not established. In FIG. 32, the non-established state is highlighted by the shaded portion in order to clearly show the non-established state. Accordingly, the designer can obviously recognize the condition is not established. It may be highlighted whether the magnitude relation between the allowable range β and the allowable range γ is established, in the manner that the established state is displayed in green and the non-established state is displayed in red, and so on. When the phase angle allowable error is changed from α±7° to α±11° on the parameter change screen 510 for detecting the input of the up and down change values, the display screen of the display device 3 continuously changes as shown in FIGS. 28 to 32, and thereby, the designer can obviously recognize the non-established state without reading numerical values or the like. The display screen continuously changes in accordance with at least one of the changed phase angle allowable errors, and the steering device design assisting apparatus 1 can assist the designer to intuitively understand.

Figures 33, 34:
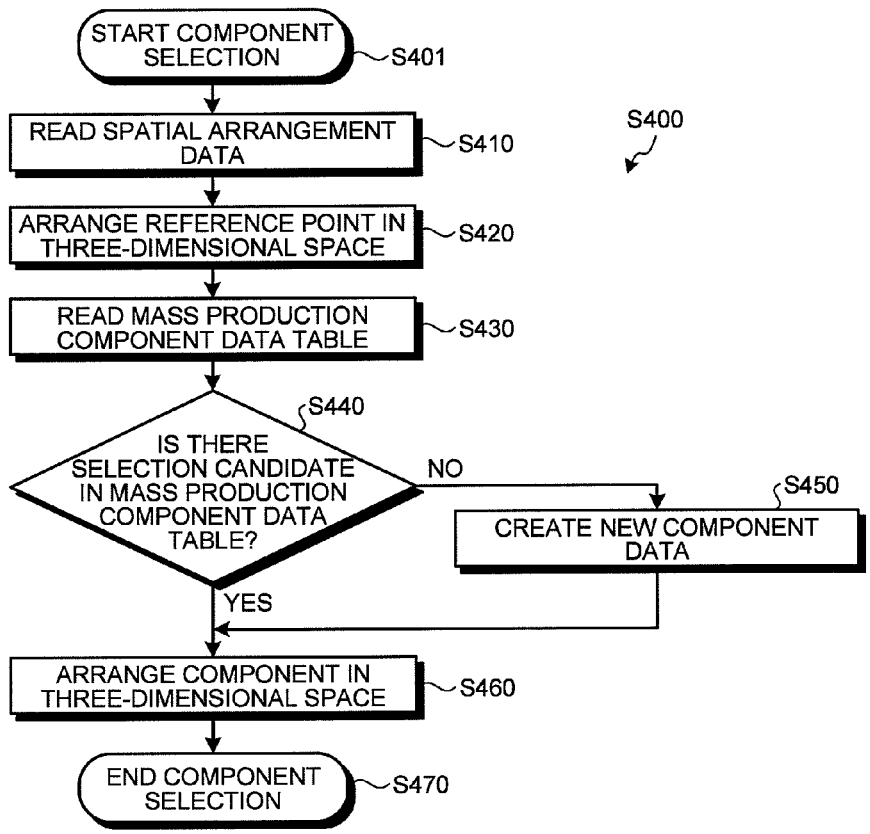
FIG. 33 is a diagram illustrating an example of an establishment table describing a relation of an allowable range $\beta$>an allowable range $\gamma$ is output.
FIG. 34 is a flowchart specifically illustrating a process procedure of the steering device design assisting apparatus 1.

The CPU 4c of the control device 4 serves as an allowable range determination unit, and compares the magnitude relation between the allowable range β and the allowable range γ from the allowable torque variation rate and the phase angle allowable error. First, the CPU 4c of the control device 4 calculates the allowable range β and the allowable range γ from the allowable torque variation rate and the phase angle allowable error. Then, the CPU 4c of the control device 4 calculates the allowable range where the relation of allowable range β>allowable range γ is established. The CPU 4c of the control device 4 outputs the calculation result of the allowable range as, for example, a condition establishment table 511 in which the established state is denoted by o and the non-established state is denoted by x as shown in FIG. 33. Since the condition establishment table 511 is created, the allowable range becomes apparent. The CPU 4c of the control device 4 stores the condition establishment table 511 in the internal storage device 4*f* or the external storage device 5 (step S370). Then, the control device 4 of the steering device design assisting apparatus 1 ends the calculation of the allowable range (step S380).

Figure 35:
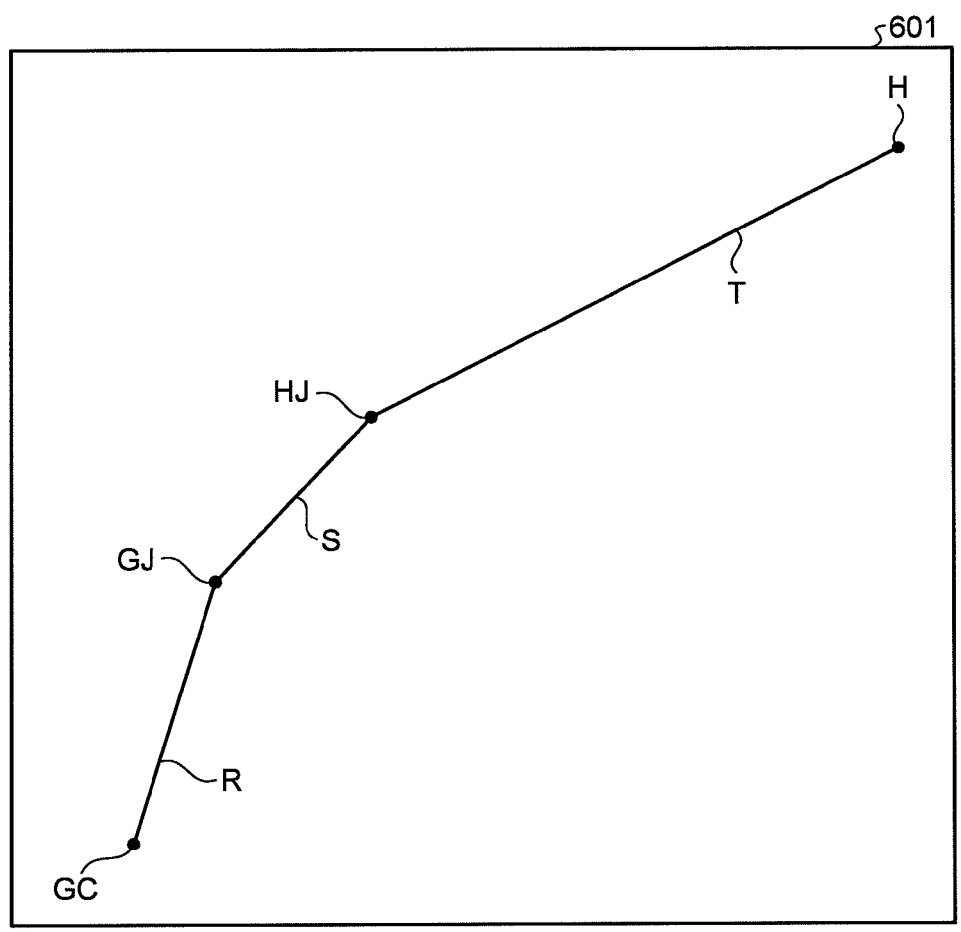
FIG. 35 is a diagram illustrating an example of the output display screen 503 of the reference axis and the reference points arranged in the three-dimensional space.

Next, the procedure of the component selection step in step S400 of FIG. 13 will be specifically described by referring to FIG. 34. As shown in FIG. 34, the control device 4 of the steering device design assisting apparatus 1 starts a component selection (step S401). First, the control device 4 reads spatial arrangement data of the handle position reference point H, the reference point HJ of the universal joint 20, the reference point GJ of the universal joint 30, and the steering gear reference point GC in the three-dimensional space (step S410). Next, the control device 4 arranges the handle position reference point H, the reference point HJ of the universal joint 20, the reference point GJ of the universal joint 30, and the steering gear reference point GC in the three-dimensional space, as shown in an output screen 601 of FIG. 35 (step S420).

Next, the CPU 4*c* of the control device 4 serves as a component condition calculation unit, and searches for whether a selection candidate is present in a mass component production table (step S440). FIGS. 36A, 36B, and 36C are diagrams illustrating an example of the data table of the mass production component. Mass production component data tables 701 shown in FIG. 36A is data tables in which a tube length and a phase angle error for each component are stored, and are stored in advance in the internal storage device 4*f* or the external storage device 5. Mass production component data table 711 shown in FIG. 36B is data table in which a shaft length and a phase angle error for each component are stored, and are stored in advance in the internal storage device 4*f* or the external storage device 5. A mass production component data table 721 shown in FIG. 36C is a data table in which data of a target fitting length obtained by combining the slide tube yoke component and the slide shaft yoke component with each other is stored, and is stored in advance in the internal storage device 4*f* or the external storage device 5. The data of the target fitting length is a target value, and is a value with an adjustment range (for example, 10 mm) before and after the target value with respect to the target value. The joint length W between HJ and GJ per the combination of the components is determined by adding the tube length of the slide tube yoke component and the shaft length of the slide shaft yoke component, and subtracting the fitting length from the added value.

The CPU 4*c* of the control device 4 reads out the mass production component data tables 701, 711, and 721 shown in FIGS. 36A, 36B, and 36C to the RAM 4*e*, and stores the tables therein (step S430). The CPU 4*c* of the control device 4 reads out the component condition data table 507 obtained in the above step S350 from the external storage device 5 or the internal storage device 4*f* to the RAM 4*e*. The CPU 4*c* of the control device 4 selects the combination of the slide tube yoke component and the slide shaft yoke component satisfying the condition of the joint length W between HJ and GJ in the component condition data table 507. For example, as shown in FIG. 20, in the component condition data table 507 obtained in step S350, the joint length W is 291 mm. The CPU 4*c* of the control device 4 reads out the value of the joint length W from the external storage device 5 or the internal storage device 4*f* to the RAM 4*e*. The CPU 4*c* of the control device 4 applies the read joint length W to the mass production component data tables 701, 711, and 721 shown in FIGS. 36A, 36B, and 36C, and calculates the combination of the slide tube yoke component and the slide shaft yoke component satisfying the condition of the joint length W. For example, in the component condition data table 507, since the joint length W is 291 mm, the combination of the slide tube yoke component and the slide shaft yoke component satisfying 291 mm of the joint length W is selected from the mass production component data tables 701, 711, and 721 shown in FIGS. 36A, 36B, and 36C. For example, the combination of the slide tube yoke component $T_5$ and the slide shaft yoke component $S_5$ is selected from FIGS. 36A and 36B. $X_3$ satisfying 70 mm of the target fitting length is selected from FIG. 36C. The joint length W becomes $(T_5+S_5)-X_3=(180$ mm+180 mm$)-70$ mm=290 mm. The data of the fitting length is a target value, and is a value with an adjustment range before and after the target value. When $X_3$ is adjusted to be 69 mm, the combination satisfying 291 mm of the joint length W is selected. Since the range of the phase angle deviation caused by the manufacturing error is the phase angle error, it is desirable that the phase angle error be narrow when a plurality of combinations may be provided.

Figure 37:
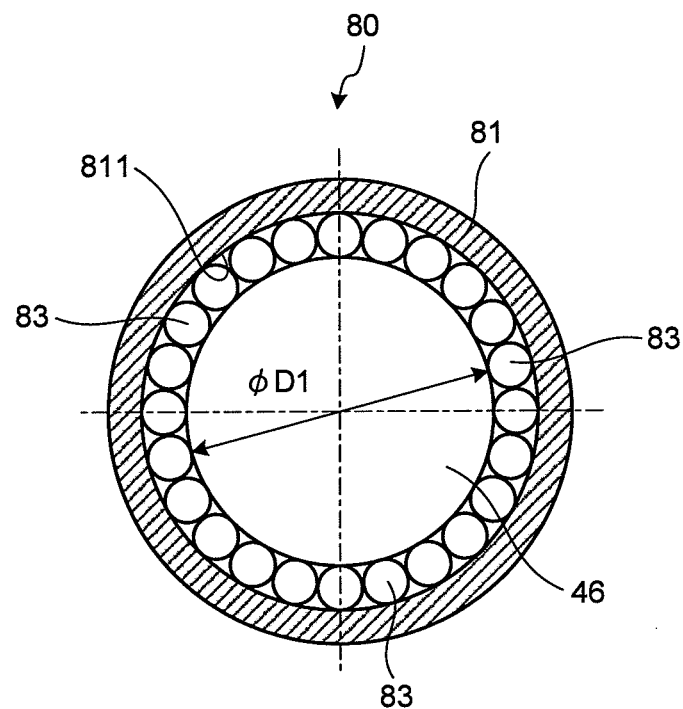
FIG. 37 is a diagram illustrating a plan cross-section of a bearing.
Figure 38:
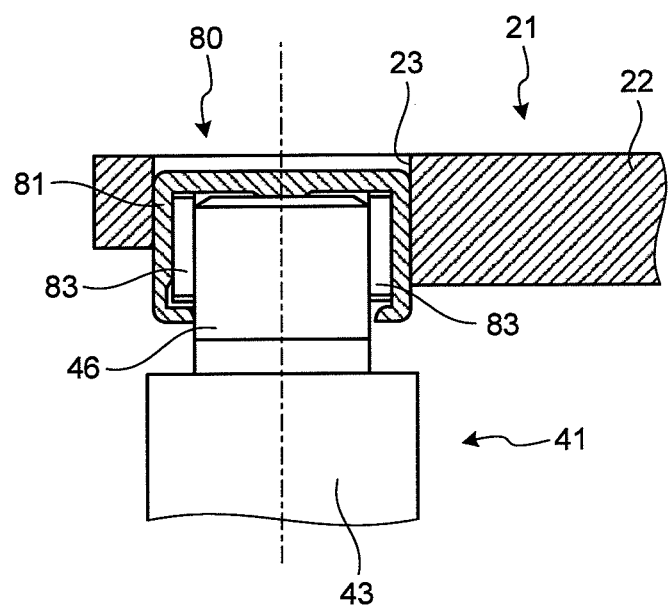
FIG. 38 is a diagram illustrating an assembly state of the bearing.
Figures 39, 40:
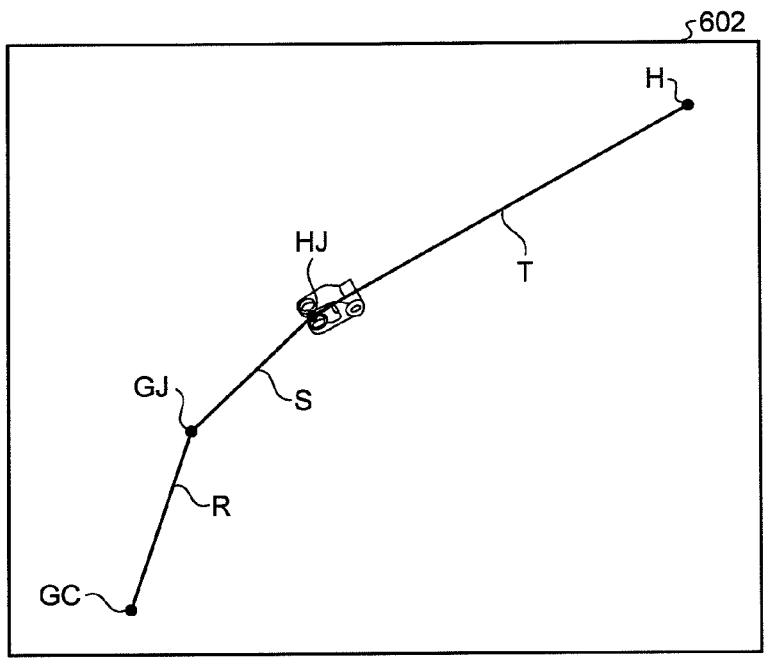
FIG. 39 is a diagram illustrating an example of a mass production component data table.
FIG. 40 is a diagram illustrating an example of the output display screen 503 of the reference axis and the reference points arranged in the three-dimensional space.

Next, the CPU 4*c* of the control device 4 selects the bearing component and the cross shaft free joint component. FIG. 37 is a diagram illustrating a plan cross-section of the bearing. FIG. 38 is a diagram illustrating an assembly state of the bearing. The bearing 80 includes a cylindrical cup-shaped outer race 81 fastened and fitted to the bearing hole, a needle 83 inserted into an inner circumference 811 of the outer race 81, and an inner edge circumference which has an inner diameter ($\phi$D1 and into which, for example, the joint 46 of the cross shaft free joint 41 is inserted. As shown in FIG. 38, the joint 46 extending from the body portion 43 of the cross shaft free joint 41 is inserted into the bearing hole 23 provided in the arm portion 22 of the column yoke 21. Then, the outer race 81 of the bearing 80 is fitted to the bearing hole 23, and is held by the arm portion 22. The joint 46 of the cross shaft free joint 41 comes into contact with the needle 83, and becomes smoothly rotatable. The designer can use a component having a different allowable joint rattling amount or a different friction amount by changing the friction coefficient of the inner circumference 811 of the outer race, the fastening degree of the outer race 81, the material (metal or resin) of the outer race 81, and the like. FIG. 39 is a diagram illustrating an example of a mass production component data table. A mass production component data table 702 is a data table in which the allowable joint rattling amount and the friction amount corresponding to the allowable joint rattling amount per the combination of the components are stored, and is stored in advance in the internal storage device 4*f* or the external storage device 5. As shown in FIG. 39, the mass production component data table 702 is correlated with the allowable joint rattling amount and the friction amount corresponding to the allowable joint rattling amount, according to the combination of the components. The CPU 4*c* of the control device 4 reads out the mass production component data table 702 stored in the internal storage device 4*f* or the external storage device 5 to the RAM 4*e*, and stores the table therein. The CPU 4*c* selects the combination of the cross shaft free joint components C1 and C2 and the bearing components B1 and B2 shown in FIG. 39 in accordance with the allowable joint rattling condition 512 in the input screen 508 shown in FIG. 21.

Next, the CPU 4*c* of the control device 4 reads out the condition establishment table 511 obtained in step S360 from the external storage device 5 or the internal storage device 4*f* to the RAM 4*e*, and stores the table therein. As described above, when the combination of the slide tube yoke component and the slide shaft yoke component is selected from the mass production component data tables 701, 711, and 721 shown in FIGS. 36A, 36B, and 36C, the CPU 4*c* of the control device 4 selects the phase angle allowable error matching with the phase angle error added by the selected combination of the slide tube yoke and the slide shaft yoke from the condition establishment table 511. For example, the phase angle allowable error α±7° is searched for in the condition establishment table 511 shown in FIG. 33, and the combination satisfying 4% or more of the torque variation rate is selected. It is desirable that the torque variation rate be small in general. In the selection of the combination of the cross shaft free joint component and the bearing, the combination according to the allowable joint rattling condition is selected. Since the cross shaft free joint component and the bearing component are combined with each other, for example, when the allowable joint rattling amount is one minute as in the combination of the cross shaft free joint component C1 and the bearing component B1, the friction amount becomes 0.005. Accordingly, the friction amount becomes smaller, but the rattling sensation when steering the steering device increases. Therefore, in accordance with the condition of the joint demanded by the vehicle, the components are selected and combined with each other. As described above, the CPU 4c of the control device 4 serves as the component selection unit, and searches for the selection candidate in the mass production component data table 702 on the basis of the information on the component condition data table 507 and the condition establishment table 511 (step S440). In the embodiment, an effort for the component selection by the designer may be reduced.

Figure 41:
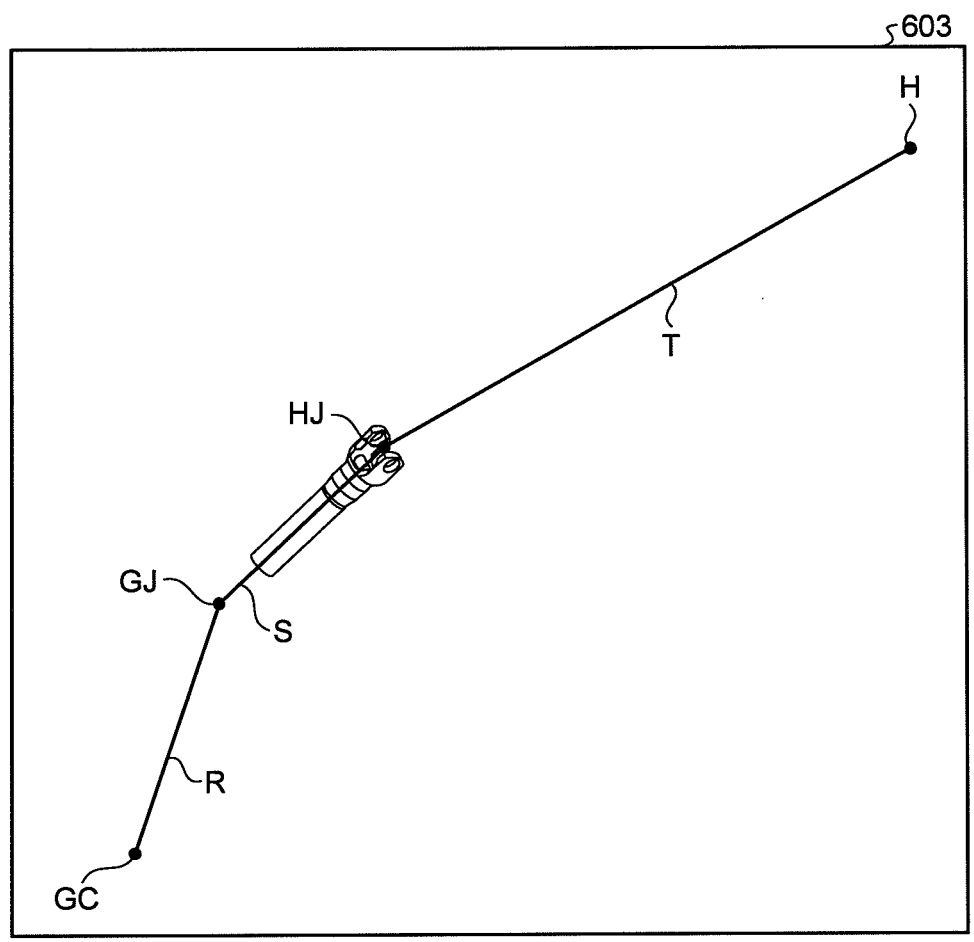
FIG. 41 is a diagram illustrating an example of the output display screen 503 of the reference axis and the reference points arranged in the three-dimensional space.
Figure 42:
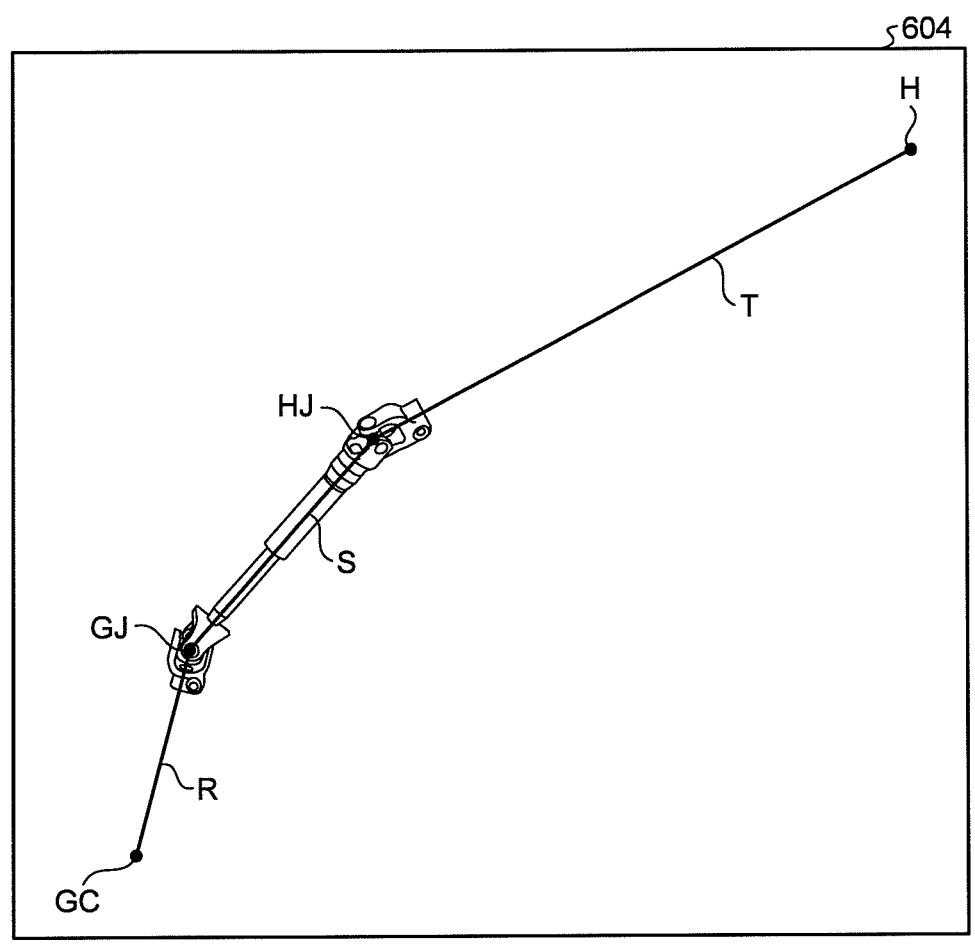
FIG. 42 is a diagram illustrating an example of the output display screen 503 of the reference axis and the reference points arranged in the three-dimensional space.

Since the mass production component can not be selected when the mass production component matching the component condition data table 507 obtained in step S350 is not present in the mass production component data table 701 and the mass production component data table 702 (step S440, No), it is necessary to create a new component data. The new component data is created by, for example, outputting the condition of the component condition data table 507 (step S450). When the mass production component matching with the mass production component data table 507 is present in the mass production component data table 701 and the mass production component data table 702 (step S440, Yes), the respective components are arranged in the three-dimensional space as shown in FIGS. 40 to 42 (step S460). FIG. 40 is a diagram illustrating an example in which the mass production component of the column yoke 21 is arranged at the reference point HJ of the universal joint 20 in the three-dimensional space. FIG. 41 is a diagram illustrating an example in which the mass production component of the slide tube yoke 11 is further arranged at the reference point HJ of the universal joint 20 of the three-dimensional space. FIG. 42 is a diagram illustrating an example in which the mass production components of the slide shaft yoke 14 and the pinion-side yoke 31 are arranged at the reference point GJ of the universal joint 30 in the three-dimensional space. In the screen 602 shown in FIG. 40, the screen 603 shown in FIG. 41, and the screen 604 shown in FIG. 42, the component can be visually determined in the three-dimensional space, and thereby, the designer can obtain an image of the arrangement. In the present embodiment, the designer can easily recognize the selected component. It may be possible that the designer inputs an instruction of reversely changing the directions of the pinch bolt holes 24 and 34 of the column yoke 21 and the pinion-side yoke 31 by 180° to the control device 4 through the input device 2, in consideration of the assembly direction.

As shown in FIG. 13, after the component selection ends, the CPU 4c of the control device 4 calculates whether the column yoke 21, the slide tube yoke 11, the slide shaft yoke 14, and the pinion-side yoke 31 interfere with the selected component or the other components of the vehicle as the limitation in design stored in the internal storage device 4f or the external storage device 5 in the three-dimensional space when the column output shaft 120b of the selected component rotates (step S500). In the case of interference, the step returns to the component selection step (step S400). In the case of no interference, the control device 4 of the steering device design assisting apparatus 1 ends the process (step S600). As described above, the designer may get assistance of the design of the steering device with the intermediate shaft to fall within the predetermined allowable torque variation.

Figure 43:
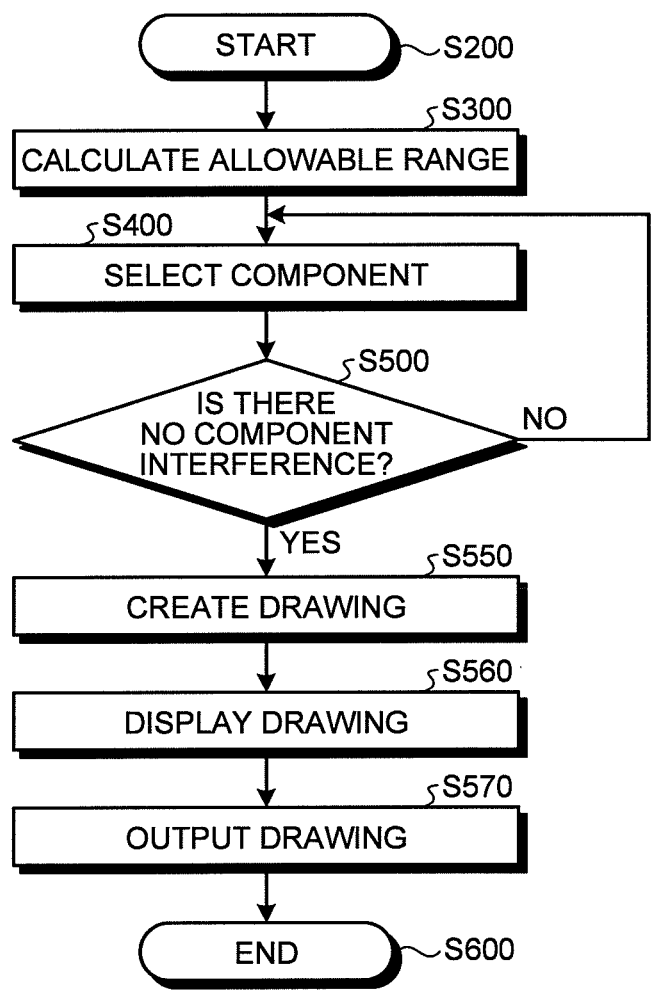
FIG. 43 is a flowchart illustrating a modified example of the embodiment.

FIG. 43 is a flowchart illustrating a modified example of the embodiment. Since the same procedures are carried out until step S500, the description thereof will not be repeated. In the modified example of the embodiment, in the case of no interference of components (step S500), the control device 4 creates a drawing (step S550). The information on the selected component, the reference point, the reference axis, the phase, and the like are converted into a two-dimensional drawing. The converted drawing is displayed on the display device 3 (step S560), and the drawing is output to the external storage device 5 (step S70). The control device 4 of the steering device design assisting apparatus 1 ends the process (step S600).

As described above, the steering device design assisting apparatus and the steering device design assisting method according to the present invention is useful for assisting the design of the steering device.

REFERENCE SIGNS LIST

1 STEERING DEVICE DESIGN ASSISTING APPARATUS
2 INPUT DEVICE
3 DISPLAY DEVICE
4 CONTROL DEVICE
4a INPUT INTERFACE
4b OUTPUT INTERFACE
4c CPU
4d ROM
4e RAM
4f INTERNAL STORAGE DEVICE
5 EXTERNAL STORAGE DEVICE
10 INTERMEDIATE SHAFT MODULE
11 SLIDE TUBE YOKE
13, 13, 16, 16, 33, 33 BEARING HOLE
14 SLIDE SHAFT YOKE
15, 15, 22, 22 ARM PORTION
21 COLUMN YOKE
23, 23 BEARING HOLE
31 PINION-SIDE YOKE
32, 32 ARM PORTION
41, 51 CROSS SHAFT FREE JOINT
43 BODY PORTION
44, 45, 46, 47, 54, 55, 56, 57 JOINT
60 PINION SHAFT
61b RACK
70 TIE-ROD
80 BEARING
81 OUTER RACE
38 NEEDLE
103 STEERING MECHANISM
105 IGNITION SWITCH
107 VEHICLE SPEED SENSOR
110 HANDLE
120a INPUT SHAFT
120b COLUMN OUTPUT SHAFT

130 TORQUE SENSOR
140 AUXILIARY STEERING MECHANISM
150 SPEED REDUCING GEAR BOX
160 ELECTRIC MOTOR
H HANDLE POSITION REFERENCE POINT
HJ REFERENCE POINT OF UNIVERSAL JOINT
GJ REFERENCE POINT OF UNIVERSAL JOINT
GC STEERING GEAR REFERENCE POINT

The invention claimed is:

1. A design assisting apparatus of a steering device including a steering mechanism with a column yoke, a slide tube yoke, a slide shaft yoke, and a pinion-side yoke,
the design assisting apparatus comprising:
a storage unit that stores a coordinate of a handle position reference point of a handle, a coordinate of a first universal joint reference point connecting the column yoke and the slide tube yoke, a coordinate of a second universal joint reference point connecting the slide shaft yoke and the pinion-side yoke, a coordinate of a steering gear reference point, an allowable torque variation rate, and a phase angle allowable error which is a range of a phase angle deviation caused by a manufacturing error;
an input unit that accepts a change of the allowable torque variation rate or the phase angle allowable error;
a reference point arrangement unit that arranges the coordinate of the handle position reference point, the coordinate of the first universal joint reference point, the coordinate of the second universal joint reference point, and the coordinate of the steering gear reference point, in a three-dimensional space in which the longitudinal, vertical, and lateral directions of a vehicle are determined;
a reference axis calculation unit that calculates a reference axis passing through the second universal joint reference point from the first universal joint reference point;
a phase angle calculation unit that calculates a phase angle which is an angle between a first projection line which is a straight line from the handle position reference point to the first universal joint reference point projected onto a projection plane perpendicular to the reference axis and a second projection line which is a straight line from the second universal joint reference point to the steering gear reference point projected onto the projection plane;
a control device that calculates a torque variation rate-phase angle curve as a function of a torque variation rate and the phase angle, wherein the torque variation rate is a ratio between an input torque and an output torque, the input torque is a torque on one axis connecting between the handle position reference point and the first universal joint reference point and the output torque is a torque on another axis connecting between the steering gear reference point and the second universal joint reference point;
an allowable range determination unit that determines success or failure of a condition in which an allowable range of the phase angle allowable error is included in an allowable range corresponding to the allowable torque variation rate based on the torque variation rate-phase angle curve; and
a display unit that displays the allowable range corresponding to the allowable torque variation rate and the allowable range of the phase angle allowable error.

2. The design assisting apparatus according to claim 1, wherein the allowable range determination unit determines success or failure of a condition in which the allowable range of the phase angle allowable error is included in the allowable range corresponding to the allowable torque variation rate, in each stage of an up stage, a middle stage, and a down stage of a tilt operation.

3. The design assisting apparatus according to claim 1, wherein the storage unit stores an allowable torque variation rate or a phase angle allowable error changed through the input unit,
wherein the allowable range determination unit calculates an allowable range corresponding to the allowable torque variation rate based on the allowable torque variation rate stored in the storage unit and an allowable range of the phase angle allowable error based on the phase angle allowable error stored in the storage unit, and
wherein the display unit simultaneously displays the allowable range corresponding to the allowable torque variation rate calculated in the allowable range determination unit and the allowable range of the phase angle allowable error calculated in the allowable range determination unit.

4. The design assisting apparatus according to claim 2, wherein the storage unit stores an allowable torque variation rate or a phase angle allowable error changed through the input unit,
wherein the allowable range determination unit calculates an allowable range of the allowable torque variation rate based on the allowable torque variation rate stored in the storage unit and an allowable range corresponding to the phase angle allowable error based on the phase angle allowable error stored in the storage unit, and
wherein the display unit simultaneously displays the allowable range of the allowable torque variation rate calculated in the allowable range determination unit and the allowable range corresponding to the phase angle allowable error calculated in the allowable range determination unit.

5. The design assisting apparatus according to claim 3, wherein the allowable range determination unit highlights on the display unit, in a case of failure of the condition in which the allowable range of the phase angle allowable error is included in the allowable range corresponding to the allowable torque variation rate.

6. The design assisting apparatus according to claim 4, wherein the allowable range determination unit highlights on the display unit, in a case of failure of the condition in which the allowable range of the phase angle allowable error is included in the allowable range corresponding to the allowable torque variation rate.

7. The design assisting apparatus according to claim 1, wherein the allowable range determination unit creates a condition establishment table indicating a combination of the condition in which the allowable range of the phase angle allowable error is included in the allowable range corresponding to the allowable torque variation rate.

8. The design assisting apparatus according to claim 2, wherein the allowable range determination unit creates a condition establishment table indicating a combination of the condition in which the allowable range of the phase angle allowable error is included in the allowable range corresponding to the allowable torque variation rate.

9. The design assisting apparatus according to claim 7, further comprising:

a storage unit that stores a data table of a mass production component;

a component condition calculation unit that calculates a component condition from the coordinate of the handle position reference point, the coordinate of the first universal joint reference point, the coordinate of the second universal joint reference point, and the coordinate of the steering gear reference point; and a component selection unit that selects a mass production component from the data table of the mass production component based on the component condition and the condition establishment table.

10. The design assisting apparatus according to claim 9, wherein the component selection unit selects the column yoke, the slide tube yoke, the slide shaft yoke, and the pinion-side yoke, and wherein a connection point between the column yoke and the slide tube yoke is arranged at the first universal joint reference point in the three-dimensional space and a connection point between the slide shaft yoke and the pinion-side yoke is arranged at the second universal joint reference point in the three-dimensional space.

11. A design assisting method of a steering device for assisting a design of the steering device including a steering mechanism with a column yoke, a slide tube yoke, a slide shaft yoke, and a pinion-side yoke, using a computer, the design assisting method including:

storing a coordinate of a handle position reference point of a handle, a coordinate of a first universal joint reference point connecting the column yoke and the slide tube yoke, a coordinate of a second universal joint reference point connecting the slide shaft yoke and the pinion-side yoke, a coordinate of a steering gear reference point, an allowable torque variation rate, and a phase angle allowable error which is a range of a phase angle deviation caused by a manufacturing error;

arranging the coordinate of the handle position reference point, the coordinate of the first universal joint reference point, the coordinate of the second universal joint reference point, and the coordinate of the steering gear reference point in a three-dimensional space in which the longitudinal, vertical, and lateral directions of a vehicle are determined;

calculating a reference axis passing through the second universal joint reference point from the first universal joint reference point;

calculating a phase angle which is an angle between a first projection line which is a straight line from the handle position reference point to the first universal joint reference point projected onto a projection plane perpendicular to the reference axis and a second projection line which is a straight line from the second universal joint reference point to the steering gear reference point projected onto the projection plane;

calculating a torque variation rate-phase angle curve as a function of a torque variation rate and the phase angle, wherein the torque variation rate is a ratio between an input torque and an output torque, the input torque is a torque on one axis connecting between the handle position reference point and the first universal joint reference point and the output torque is a torque on another axis connecting between the steering gear reference point and the second universal joint reference point;

determining success or failure of a condition in which an allowable range of the phase angle allowable error is included in an allowable range corresponding to the allowable torque variation rate based on the torque variation rate-phase angle curve; and displaying the allowable range corresponding to the allowable torque variation rate and the allowable range of the phase angle allowable error calculated in the determining.

12. The design assisting method according to claim 11, wherein the determining includes determining success or failure of a condition in which the allowable range of the phase angle allowable error is included in the allowable range corresponding to the allowable torque variation rate, in each stage of an up stage, a middle stage, and a down stage of a tilt operation.

13. The design assisting method according to claim 11, wherein the determining includes, when at least one of the allowable torque variation rate and the phase angle allowable error stored in the storing is changed, calculating at least one of an allowable range corresponding to the allowable torque variation rate based on the changed allowable torque variation rate or an allowable range of the phase angle allowable error based on the changed phase angle allowable error, and wherein the displaying includes simultaneously displaying the allowable range corresponding to the allowable torque variation rate calculated in the determining and the allowable range of the phase angle allowable error calculated in the determining.

14. The design assisting method according to claim 12, wherein the determining includes, when at least one of the allowable torque variation rate and the phase angle allowable error stored in the storing is changed, calculating at least one of an allowable range corresponding to the allowable torque variation rate based on the changed allowable torque variation rate or an allowable range of the phase angle allowable error based on the changed phase angle allowable error, and wherein the displaying includes simultaneously displaying the allowable range corresponding to the allowable torque variation rate calculated in the determining and the allowable range of the phase angle allowable error calculated in the determining.

15. The design assisting method according to claim 13, wherein the displaying includes highlighting when the failure of the condition in which the allowable range of the phase angle allowable error is included in the allowable range corresponding to the allowable torque variation rate is determined in the determining.

16. The design assisting method according to claim 14, wherein the displaying includes highlighting when the failure of the condition in which the allowable range of the phase angle allowable error is included in the allowable range corresponding to the allowable torque variation rate is determined in the determining.

17. The design assisting method according to claim 1, wherein the determining includes creating a condition establishment table indicating a combination of the condition in which the allowable range of the phase angle allowable error is included in the allowable range corresponding to the allowable torque variation rate.

18. The design assisting method according to claim 12, wherein the determining includes creating a condition establishment table indicating a combination of the condition in which the allowable range of the phase angle allowable error is included in the allowable range corresponding to the allowable torque variation rate.

19. The design assisting method according to claim 17, further including:

storing a data table of a mass production component;

calculating a component condition from the coordinate of the handle position reference point, the coordinate of the first universal joint reference point, the coordinate of the second universal joint reference point, and the coordinate of the steering gear reference point; and selecting a mass production component from the data table of the mass production component based on the component condition and the condition establishment table.

20. The design assisting method according to claim 19, wherein the selecting includes selecting the column yoke, the slide tube yoke, the slide shaft yoke, and the pinion-side yoke, and the design assisting method includes arranging a connection point between the column yoke and the slide tube yoke at the first universal joint reference point in the three-dimensional space and arranging a connection point between the slide shaft yoke and the pinion-side yoke at the second universal joint reference point in the three-dimensional space.

* * * * *